US008290174B1

(12) United States Patent
Simon

(10) Patent No.: US 8,290,174 B1
(45) Date of Patent: Oct. 16, 2012

(54) APPARATUS AND METHOD FOR AUTHORIZING REPRODUCTION AND CONTROLLING OF PROGRAM TRANSMISSIONS AT LOCATIONS DISTANT FROM THE PROGRAM SOURCE

(76) Inventor: Jeffrey Franklin Simon, Doylestown, PA (US)

( * ) Notice: Subject to any disclaimer, the term of this patent is extended or adjusted under 35 U.S.C. 154(b) by 0 days.

(21) Appl. No.: 13/205,234

(22) Filed: Aug. 8, 2011

Related U.S. Application Data

(62) Division of application No. 12/023,852, filed on Jan. 31, 2008, now Pat. No. 7,995,770.

(60) Provisional application No. 60/899,290, filed on Feb. 2, 2007.

(51) Int. Cl.
*H05K 11/12* (2006.01)

(52) U.S. Cl. ................. 381/82; 381/77; 381/79; 381/80

(58) Field of Classification Search .................... 381/82, 381/77, 79, 312, 314–315
See application file for complete search history.

(56) References Cited

U.S. PATENT DOCUMENTS

| | | | | |
|---|---|---|---|---|
| 2,567,431 | A | 9/1951 | Halstead | |
| 3,235,804 | A | 2/1966 | McIntosh | |
| 3,906,160 | A | 9/1975 | Nakamura et al. | |
| 4,165,487 | A | 8/1979 | Corderman | |
| 4,610,024 | A | 9/1986 | Schulhof | |
| 4,618,987 | A | 10/1986 | Steinke et al. | |
| 4,829,500 | A | 5/1989 | Saunders | |
| 4,899,388 | A | 2/1990 | Mlodzikowski et al. | |
| 4,993,074 | A | 2/1991 | Carroll | |
| 5,058,169 | A | 10/1991 | Temmer | |
| 5,131,051 | A | 7/1992 | Kishinaga et al. | |
| 5,432,858 | A | 7/1995 | Clair, Jr. et al. | |
| 5,619,582 | A * | 4/1997 | Oltman et al. | 381/82 |
| 5,668,884 | A | 9/1997 | Clair, Jr. et al. | |
| 5,757,932 | A | 5/1998 | Lindemann et al. | |
| 5,822,440 | A | 10/1998 | Oltman et al. | |
| RE38,405 | E | 1/2004 | Clair, Jr. et al. | |
| 7,043,031 | B2 | 5/2006 | Klayman et al. | |
| 7,788,279 | B2 | 8/2010 | Mohajer et al. | |
| 7,881,657 | B2 | 2/2011 | Wang et al. | |
| 2008/0123869 | A1 | 5/2008 | Huang | |

FOREIGN PATENT DOCUMENTS

| | | |
|---|---|---|
| FR | 2006116 | 12/1969 |
| JP | 55-077295 | 6/1980 |
| JP | 57-202138 | 12/1982 |
| WO | 92/05673 | 4/1992 |

OTHER PUBLICATIONS

Tontechnick-Rechner—Sengpielaudio, "Calculation: Speed of Sound C in Air and the Important Temperature", www.sengpielaudio.com/calculator-speedsound, printed Jan. 8, 2008, 5 pages.
Tontechnick-Rechner—Sengpielaudio, "Calculation: Speed of Sound in Humid Air", www.sengpielaudio.com/calculator-airpressure, printed Jan. 15, 2008, 12 pages.

(Continued)

*Primary Examiner* — Dung A. Le

(57) ABSTRACT

A wireless device and method may comprise a receiver and method for receiving wireless transmissions including locating data, authorization data and program data, and for determining its location from the locating data and a stored representation of a venue. Authorization data and locating data are used to authorize reproduction and/or controlling of received program data. The device and method may determine a delay time to its location for delaying the received program data to be substantially in time alignment with natural sound, and to be so reproduced and/or recorded. Optionally, a binaural microphone may pick up ambient sound which is mixed or combined with the delayed program data for producing a combined stereo audio signal.

103 Claims, 7 Drawing Sheets

OTHER PUBLICATIONS

Tim Brice and Todd Hall, National Weather Service Forecast Office, "The Speed of Sound Calculation" www.srh.noaa.gov/elp/wxcalc/speedofsound, printed Jan. 8, 2008, 2 pgs.

Pictures "Effectron", Special Effects Generator (Delta Lab), prior to Jan. 31, 2008.

* cited by examiner

APPARATUS AND METHOD FOR AUTHORIZING REPRODUCTION AND CONTROLLING OF PROGRAM TRANSMISSIONS AT LOCATIONS DISTANT FROM THE PROGRAM SOURCE

This Application is a division of U.S. patent application Ser. No. 12/023,852 entitled "APPARATUS AND METHOD FOR ALIGNING AND CONTROLLING RECEPTION OF SOUND TRANSMISSIONS AT LOCATIONS DISTANT FROM THE SOUND SOURCE" filed Jan. 31, 2008 now U.S. Pat. No. 7,995,770, which claims the benefit of U.S. Provisional Application Ser. No. 60/899,290 entitled "SYSTEM AND METHOD FOR AUDIO REPRODUCTION TIME ALIGNMENT FOR A DISPARATE LOCATION FROM THE AUDIO SIGNAL SOURCE" which was filed Feb. 2, 2007, each of which is hereby incorporated herein by reference in its entirety.

The present invention relates to a wireless device and method, and in particular, to a wireless device and method for authorizing program data.

Concerts, entertainments and other events have increasingly been coming to be held in large venues, not just in theaters, but in arenas, stadiums, amphitheaters, parks, neighborhoods, and the like. Such venues present challenges in providing quality audio programming to the audience due to unique acoustical and technical issues.

As the size of the venue has grown, the audience has come to extend further and further from the source of the performance. In a typical theater, even the last row is usually only 100-200 feet from the stage and so the performance can be seen and heard fairly well. In a stadium, however, parts of the audience can be many hundreds of feet from the stage and the performers, and so the time that it takes for the sound to propagate through the air to the audience can become discernable to the listener, e.g., he can detect that the sound he is hearing is not synchronized with the performance he sees, as best he can.

At some live concerts in Philadelphia, for example, the audience covers an area extending for over a mile along a wide Parkway (having roads and park lands) from the Art Museum almost to City Hall. On the National Mall in Washington, D.C., for example, an audience of hundreds of thousands may be spread out over an enormous mall area with some being thousands of feet from the stage and the performers.

Various sound processing and amplification arrangements have been devised for reproducing sound from loudspeakers that are located at various locations over such venue, with the amplified sound being reproduced at different times by different loudspeakers so as to tend to provide coherent sound throughout most if not all of the venue, and large video screens may be provided to display images of the performance for those who are too far away from the stage to appreciate the performance using their natural vision.

Audio reception devices have come to be employed in these sorts of venues so that the audience may hear a purer or cleaner reproduction of the audio via a radio broadcast than they might hear from the origin or via the loudspeakers given the presence of other sources of sound, e.g., talking and singing and screaming by other audience members, cell phone ringers and conversations, and noise sources such as vehicles, sirens, food vendors and other concessions, hawkers, wind, aircraft, and the like. A major problem with conventional audio devices is that the sound they reproduce will precede in time the natural sound from the origin and the loudspeakers which typically are close to the origin. This is because the speed of sound in air (the natural sound) is much slower (about 4.5 seconds per mile) than is the speed of radio waves in air (which approaches the about 186,000 miles per second speed of light). This difference produces a discernable delay in the arrival of natural sound after the arrival of the radio broadcast sound, and this difference can be both annoying and undesirable.

To address this shortcoming, several different approaches have been described. In one, the audio device has a manually adjustable delay that the user can adjust so that the received radio broadcast sound is delayed sufficiently that it apparently coincides with the arriving natural sound. Recognizing that this manual adjustment could be difficult for many users, and inconvenient, several automated schemes have been devised. In one such scheme, a microphone of the audio device picks up the local natural sound and attempts to electronically correlate the local natural sound with the received broadcast sound, but often (if not usually, at a concert), there is so much non-program noise in the local natural sound that no correlation can be made and the device fails to operate properly.

In another such scheme, the broadcast sound is transmitted over several channels in each of which the audio is delayed by a small amount, e.g., 30 milliseconds (msec.) from the previous channel, and the audio device determines its radial distance from the stage to select the channel that provides a delay that approximates the actual delay of the natural sound. The matching of the delay is almost always imperfect, and so the user will often be dissatisfied with the reproduced sound. It would be quite costly and likely not practical to broadcast enough channels to accommodate the wide range of delays that would be experienced in a larger venue, especially considering the complexity that would introduce into the transmitters as well as the receivers. Sometimes, "close enough" is not good enough.

In some venues, such as an arenas and a stadium, the arrangements of loudspeakers around a stage inherently create areas or zones wherein the phasing of a stereo sound is reversed, i.e. the loudspeaker on a listener's left is producing right channel audio and the loudspeaker on the listener's right is producing left channel audio. Neither of the foregoing systems and their audio reception devices address this problem, with the result that the stereo audio reproduced in the head sets thereof is out of phase with the live natural stereo sound and the resulting cancellation effect tends to produce monaural sound.

All of the foregoing lack ability to control access and use of received program data such as by authorizations and ticketing. Accordingly, there is a need for a device and method that provide for authorizing the reception and controlling of program material. This may be provided in a device and system that automatically and reliably synchronize broadcast and natural program material, e.g., broadcast audio and natural sound. Additionally and alternatively, this may also be provided in a device and system that automatically address the effects of reversed stereo phasing. Desirably, such arrangement would also provide other features that could enhance the experience of the user.

According to one aspect, a wireless device and method may comprise a receiver and method for receiving wireless transmissions including locating data, authorization data and program data, and for determining its location from the locating data and a stored representation of a venue. Authorization data and locating data are used to authorize reproduction and/or controlling of received program data. The device and method may determine a delay time to its location for delaying the received program data to be substantially in time alignment with natural sound, and to be so reproduced and/or recorded. Optionally, a binaural microphone may pick up ambient sound which is mixed or combined with the delayed program data for producing a combined stereo audio signal.

BRIEF DESCRIPTION OF THE DRAWING

The detailed description of the preferred embodiment(s) will be more easily and better understood when read in conjunction with the FIGURES of the Drawing which include.

Figure 1:
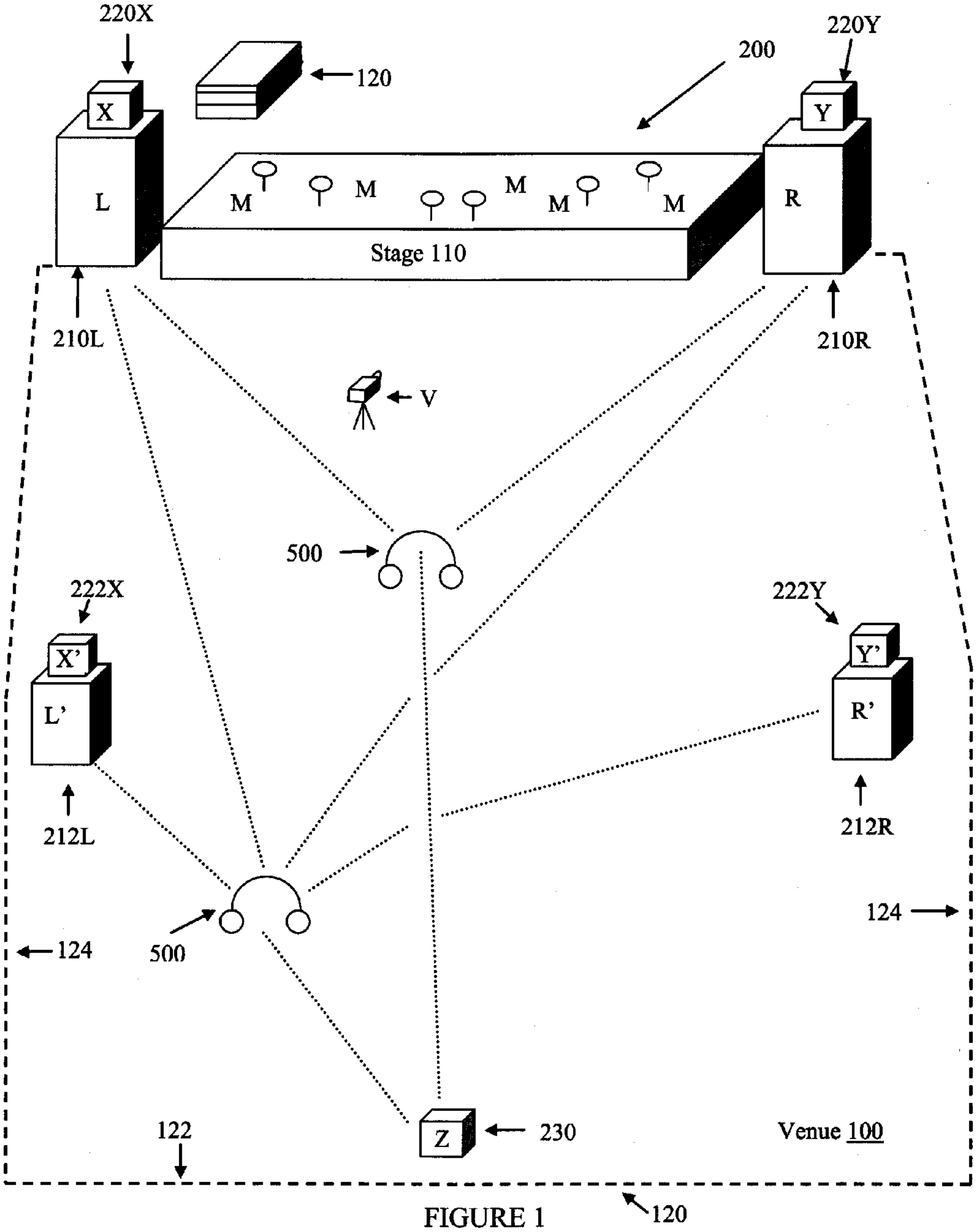
FIG. 1 is a schematic diagram of an example venue wherein sound is propagated from a program source to a reception region.

In the Drawing, where an element or feature is shown in more than one drawing figure, the same alphanumeric designation may be used to designate such element or feature in each figure, and where a closely related or modified element is shown in a figure, the same alphanumerical designation primed or designated "a" or "b" or the like may be used to designate the modified element or feature. Similarly, similar elements or features may be designated by like alphanumeric designations in different figures of the Drawing and with similar nomenclature in the specification. It is noted that, according to common practice, the various features of the drawing are not to scale, and the dimensions of the various features are arbitrarily expanded or reduced for clarity, and any value stated in any Figure is given by way of example only.

DESCRIPTION OF THE PREFERRED EMBODIMENT(S)

FIG. 1 is a schematic diagram of an example venue 100 wherein sound is propagated from a program source, e.g., stage 110, to a reception region 120. Venue 100 includes a boundary 120 within which a program performed on stage 110 may be seen and heard. Boundary 120 may be defined by a physical structure such as the walls of a room, auditorium, arena or stadium, or may be a non-physical boundary 120 which would not impede the viewing and/or hearing of a program, such as imaginary lines, ropes or tapes, a fence, saw horses or the like. In venue 100, e.g., a program may be performed on stage 110 wherein the sound (audio) thereof is picked up by one or more microphones M and after processing, is propagated into venue 100 via one or more loudspeakers 210, 212.

Typically, sound from microphones M on the right half of stage 110 is reproduced by loudspeaker 210R located at the right of stage 110 and sound from microphones M on the left half of stage 110 is reproduced by loudspeaker 210L located at the left of stage 110. Where the distance from stage 110 to the rear of venue 100 (i.e. to boundary 122 of boundary 120 that is farthest from stage 110) is substantial, one or more additional auxiliary loudspeakers 212R, 212L, respectively reproducing the right and left program sound may be placed in relatively rightward and leftward locations near side boundaries 124 intermediate stage 110 and rear boundary 122.

Auxiliary loudspeakers 212R, 212L are also referred to as delay speakers because the program audio reproduced thereby is typically delayed in time from the program audio as reproduced by primary loudspeakers 210. Where personal receivers 500 as described herein are utilized, because the time delay arrangement provided thereby is accurate and adapts to movement of receiver 500 in venue 100 and to the actual current atmospheric condition, delay speakers 212 may be eliminated in many applications or may be limited to reproducing only the lower sub-frequencies, e.g., 20 Hz to 120 Hz.

Apparatus 200 for receiving audio from microphones M, for processing such audio, and for driving loudspeakers 210, 212 may be provided in a control center 120 or any other convenient location, and may be a permanent part of venue 100 or may be portable, e.g., in a trailer or other vehicle. While illustrated in relation to example venues 100 having a stage 110, of the sort that might be used for concerts, ceremonies, performances, and/or other entertainments, the present arrangement is not limited to such standard and/or formalized venues and locations. For simplicity, all such will be referred to as venues and as performances or programs thereat. One or more video cameras V may be provided for providing video images of the performance which may be processed, e.g., mixed, and distributed via apparatus 200.

In addition to the processing and amplification of the audio program, apparatus 200 preferably also includes wireless transmitters 220, 230 for broadcasting at least within boundary 120 of venue 100. Preferably, wireless transmitter 220X is located proximate left loudspeaker 210L and wireless transmitter 220Y is located proximate right loudspeaker 210R, preferably in vertical alignment with loudspeakers 210L, 210R, so that the wireless signals transmitted thereby originate in substantial co-location with the amplified audio from loudspeakers 210. Where auxiliary loudspeakers 212 are employed, optional auxiliary wireless transmitter 222X is located proximate auxiliary left loudspeaker 212L and optional auxiliary wireless transmitter 222Y is located proximate right loudspeaker 212R, preferably in vertical alignment therewith.

Wireless transmitters 220, 222, 230 may be referred to as telemetry transmitters or telemetry beacons in view of their telemetering data such as program data, location data, atmospheric data, and the like, and/or may also be referred to as beacon transmitters in view of their function in providing transmissions (beacons) from which personal receivers 500 determine their respective physical locations.

Signals transmitted by transmitters 220X, 220Y include at least left and right audio program, atmospheric data, and respective locating signals, which could be a carrier signal and/or data modulated on a carrier signal. Signals transmitted by optional auxiliary wireless transmitters 222X, 222Y may include at least respective locating signals, which could be a carrier signal and/or data modulated on a carrier signal. Apparatus 200 may further comprise an auxiliary wireless transmitter 230 preferably located relatively rearward in venue 100 for transmitting at least a locating signal, which also could be a carrier signal and/or data modulated on a carrier signal. Signals transmitted by transmitters 220, 222, 230 are illustrated by the jagged lines emanating therefrom. Signals transmitted by transmitters 220, 222, 230 are synchronized for accuracy in determining location therefrom, as described below.

The audience, hereinafter users or listeners, may have personal receivers 500 for receiving and processing signals transmitted by wireless transmitters 220, 222, 230 as may be employed, whereby the transmitted audio program may be listened to via loudspeakers, typically headphones or ear buds or ear phones or another transducer, of receiver 500. Receivers 500 each receive the respective locating signals transmitted by transmitters 220X and 220Y, and optionally by transmitter 230, from which each receiver 500 determines its location within venue 100, including its distance from speakers 210R, 210L, and speakers 212R, 212L, if present. Typically, the locating signal transmitted by each transmitter is unique to that transmitter 220X, 222X, 220Y, 222Y, 230, e.g., by frequency or by data therein, so that which signal originated at which transmitter is known so that the location of receiver 500 within area 120 of venue 100 may be determined. Transmitters 220, 222, 220X, 222X, 220Y, 222Y, 230, 230Z may also be referred to as beacons or as telemetry transmitters.

Preferably, the layout for all of loudspeakers 210, 212 is known so that the distance to the nearest loudspeaker 210, 212 is to one directing sound towards the location of receiver 500, and not one directing sound away from that location. While two sources of location data may be sufficient in certain instances, it is preferred that locating signals from three transmitters 220X, 220Y, 230 be employed in determining the location of receiver 500 for better accuracy. Where location in three dimensions is desired, it is preferred that locating signals from four transmitters 220X, 220Y, 230 not all in the same plane be employed in determining the location of receiver 500.

Personal receiver 500 utilizes its determined distance from the nearest of speakers 210, 212, and the atmospheric data received from at least one of wireless transmitters 220, 222, to determine the actual present speed of sound in venue 100 and therefrom the difference in time between the wirelessly transmitted audio program and the natural sound of the audio program as would be heard in that location from the nearest of loudspeakers 210, 212. Receiver 500 delays the wirelessly transmitted audio program by the determined difference in time and reproduces the delayed audio program in loudspeakers associated with receiver 500, so that the reproduced audio program is synchronized with, i.e. is in time alignment with, the natural sound audio program from the nearest of loudspeakers 210, 212. Where receiver 500 receives program video and/or text data from transmitters 220, 222, the video information and/or the text data may be similarly delayed by the determined time difference so as to be in time alignment with the natural sound. These and other features of receiver 500 are described further herein below.

Similarly, personal receiver 500 may determine the distance from the nearest loudspeakers 210L, 212L reproducing left channel audio and from the nearest speaker 210R, 212R reproducing right channel audio, and may then delay the corresponding channels of the wirelessly transmitted left and right channel audio by the respective delay times determined in relation to the distances from the nearest left and right channel loudspeakers, respectively. Likewise, where four or more loudspeakers 210, 212 produce four channel or greater sound (quadraphonic or surround sound), the respective distances to each of those loudspeakers may be determined and the time delay of the natural sound therefrom may also be determined, so that the corresponding respective channels of the wirelessly transmitted audio data may be delayed by the delay time corresponding thereto, respectively.

Where auxiliary loudspeakers 212L, 212R are employed, the sound reproduced thereby is delayed with respect to the sound produced by loudspeakers 210L, 210R so as to be synchronized, e.g., time aligned, therewith so that the natural sound throughout venue 100 is perceived as being consistent, without echo and other effects caused by time differences between the sound produced by different sources. In one alternative, transmitters 220X, 220Y associated with loudspeakers 210L, 210R, respectively, may broadcast the program audio associated with the particular loudspeaker with which it is associated. In another alternative, transmitters 222X, 222Y associated with loudspeakers 212L, 212R, respectively, may broadcast the delayed program audio associated with that particular auxiliary loudspeaker. In this alternative, the transmitted signals may include data identifying the loudspeaker and the group of loudspeakers it is part of, and its stereo phasing, so that the processing by receiver 500 described below is simplified, however, it would be more difficult to set up and synchronize larger numbers of transmitters and so the basic three or four transmitter 220X, 220Y, 230, 230Z is generally preferred.

It must be noted that the change in the speed of sound between a temperature of 50° F. (e.g., in the early morning) and of 115° F. (e.g., in the afternoon) can produce a time difference of up to about 30 milliseconds at a distance from the source of about 500 feet, which is a time difference that is normally corrected for delay loudspeakers systems of the sort used in outdoor venues, and that is considered a "Special Effect Sound" or a "Doubled Audio Signal." Time differences of as little as 5-10 milliseconds have been reported as producing perceivable effects on a listener. At distances of 3000 feet or greater, as is common in large venues such as the annual 4th of July show held on the Benjamin Franklin Parkway in Philadelphia, the out of synchronization time for natural sound can be more than about 400 milliseconds. People who attend and pay substantial admission fees for the ability to listen to and record a live concert expect to receive CD-quality (compact disk digital audio recordings) sound which requires accurate synchronization and reproduction of transmitted program audio which cannot be provided if the effect of temperature on the speed of sound is not corrected.

Figure 2:
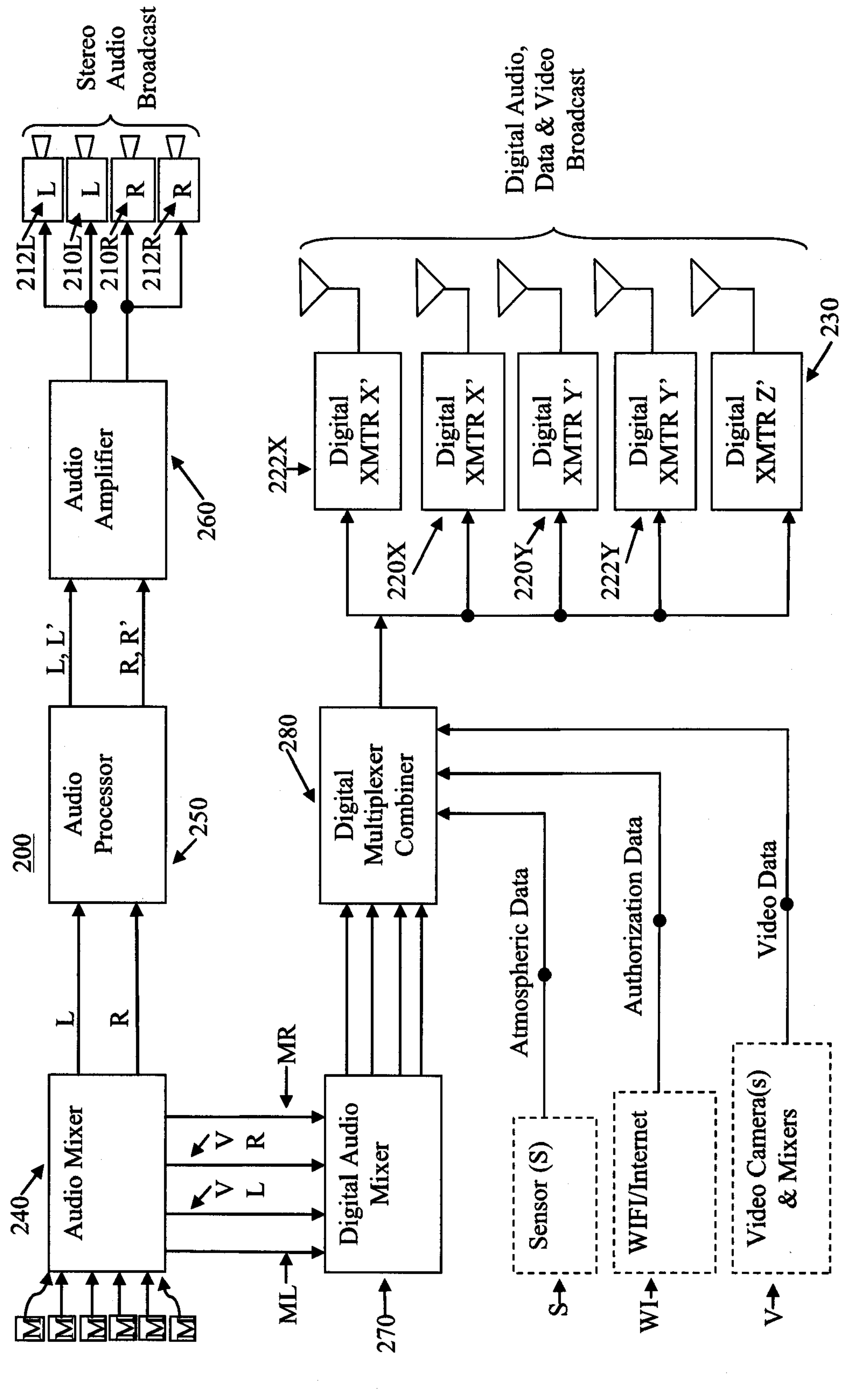
FIG. 2 is a schematic block diagram of an example embodiment of an audio and wireless transmission arrangement suitable for the example venue of FIG. 1.

FIG. 2 is a schematic block diagram of an example embodiment of an audio and wireless transmission arrangement 200 suitable for the example venue 100 of FIG. 1. The audio program, e.g., music and/or sound, picked up by microphones M is coupled to stereophonic (stereo) audio mixer 240 wherein the electrical signals from the various microphones may be adjusted and/or standardized in level and mixed together to provide plural audio tracks of a left and right L, R stereo program to audio processor 250. Processor 250 performs dynamic adjustments, equalization and speaker management, including introducing appropriate delays for stereo audio signals L', R' that will be reproduced relatively far from the main loudspeakers 210, e.g., by auxiliary speakers 212. Processed left and right audio signals are amplified by amplifier 260 and are distributed, e.g., wirelessly or via wires and/or cables, to loudspeakers 210L, 210R, 212L, 212R for stereophonic (stereo) acoustic reproduction in venue 100.

In addition, plural stereo audio tracks are provided by audio mixer 240 to digital audio mixer 270 which includes one or more analog-to-digital (A/D) converters which provide corresponding plural digitized audio tracks. Such tracks may include one or more left and right vocal tracks VL, VR, and one or more left and right instrumental music tracks ML, MR, as may be desired. The plural digitized audio tracks from digital mixer 270 are processed by digital multiplexer combiner 280 wherein they are multiplexed and/or otherwise combined and processed to configure the audio program tracks for wireless digital broadcasting. Multiplexer combiner 280 may include a computer running software for editing, changing, re-mixing and/or reconfiguring the plural audio tracks.

Multiplexer combiner 280 also receives current local atmospheric data, and may receive authorization data and/or video data from one or more video cameras V for combining with the plural digital audio tracks. While such video may be a feed from a single camera, feeds from plural video cameras may be mixed to provide a video program. Optionally, text data, such as program words and/or lyrics, a libretto, subtitles, informational messages, performer and/or actor information, and the like, and translations thereof, may also be included in the digital data provided by combiner 280.

Digital multiplexer combiner 280 provides plural digital data signals for transmission by respective ones of wireless transmitters 220, 222, 230 and also inserts identifying information into those digital data signals for identifying the transmitter that is transmitting the corresponding signal. Thus, the digital data signals provided by combiner 280 for transmitters 220, 222 includes transmitter identifying data, transmitter locating data, digital audio program data, and/or local atmospheric data, and optionally authorization data. Although all of transmitter signals would include transmitter identifying data, transmitter locating data, not all transmitter signals would need include all of the foregoing data.

In particular, current local atmospheric data includes local temperature data such as may be obtained from one or more sensors S, e.g., a thermistor, thermocouple, temperature probe or other temperature sensor suitably located at venue 100 for sensing the temperature thereat. Current local atmospheric data may also include relative humidity data and/or barometric pressure data provided by sensors S which could typically be desirable where venue 100 is very large. Temperature data therefrom is utilized, and optional humidity and pressure data may be utilized, by receivers 500 for determining the actual speed of sound under the actual current atmospheric conditions at venue 100 as described herein. Alternatively, however, it is noted that the current actual speed of sound may be determined from the current local atmospheric data by apparatus 200, e.g., by a processor associated with multiplexer combiner 280, and be transmitted by transmitters 220, 222, 230 with the other data transmitted thereby.

Such sensors S may be located near to stage 110 or control center 120, or may be at one or more locations within boundary 120, e.g., associated with one or more of transmitters 220, 222, 230, which could be advantageous for determining an average temperature or other condition for venue 100. Such sensors S may communicate with multiplexer combiner 280 via a wired and/or wireless link, or may directly communicate with and insert atmospheric data into the signals being transmitted by a particular one or ones of transmitters 220, 222, 230, e.g., a transmitter 220, 222, 230 with which it is associated.

Authorization data may include Internet Protocol (IP) addresses and/or electronic serial number (ESN) and/or other unique data identifying ones of receivers 500 that are authorized to receive and/or reproduce all or part of the signals transmitted by transmitters 220, 222, e.g., including authorizations in similar manner to which cell phones, cable TV converters, satellite TV receivers and the like are authorized to receive their respective messages and broadcasts. Authorization data may be generated locally at venue 100, or may be obtained and/or processed via the Internet, a WiFi connection, or any other suitable network WI. Typically an IP address or other unique identifier for a particular receiver 500 would be permanently stored therein.

Authorizations may represent, e.g., any one or more of admission to venue 100 and/or to any particular portion or region thereof (e.g., premium seating areas), authorization to receive stereo audio programming and/or plural track audio programming, authorization to receive video programming, authorization to record audio and/or video programming, authorization to receive text data, the maximum distance a receiver 500 can be from any one or more loudspeakers, representations of boundary 120 of venue 100 and/or of portions thereof, and the like. Thus, any receiver 500 may be controlled to operate only in certain portions of venue 100 and/or with only certain features operable, and the user may be enabled to or may be precluded from recording the programming (audio and/or video), as may be appropriate and consistent with whatever rights and/or package a user has purchased, thereby allowing receivers 500 to be controlled by the operator of the venue, performance and/or transmitters 220, 222, 230, and for preventing unauthorized receivers from being utilized to receive the transmitted program.

Authorizations may be obtained, e.g., purchased, via an Internet connection using USB interface 645, by programming by the proprietor or operator of the event or performance, and/or if receiver 500 includes a transmitter interface for WiFi or another wireless or wired network, via such network and/or the Internet.

Wireless transmitters 220, 222, 230 may be any suitable digital transmitters, and may employ radio frequency (RF), optical and/or other wireless transmissions, as may be desired, however, RF transmitters are typically preferred. Transmitters 220, 222, 230 may employ any suitable form of modulation and format, e.g., AM, FM, phase modulation, CDMA, TDMA, spread spectrum, WiFi, Bluetooth, and the like, although a digital signal format is preferred. A WiFi or other Internet compatible format is advantageous where communication via the Internet is desirable, as may be the case where user authorizations and access may be established and/or verified and/or executed via the Internet. The power levels of transmitters 220, 230 and their respective antennas may be selected, tailored and/or adjusted, if desired, to provide adequate coverage and reception within venue 100 without extending too far beyond boundary 120.

Figure 3:
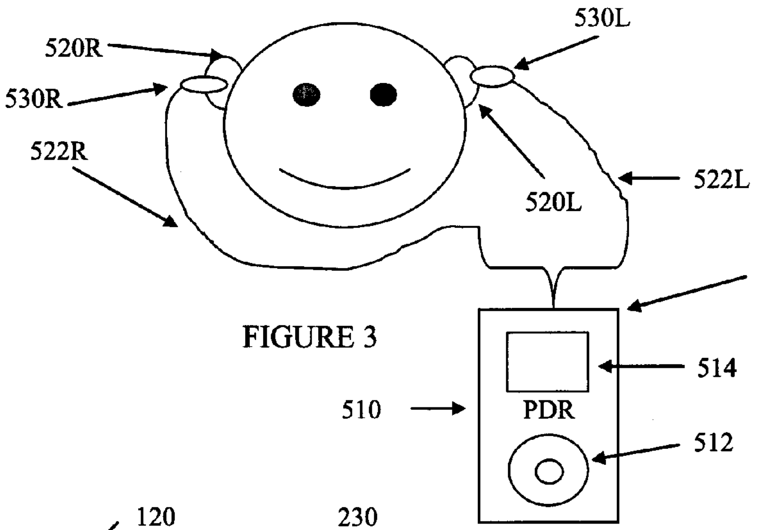
FIG. 3 is a schematic diagram of an example personal receiver useful in the example venue of FIG. 1.
Figure 4:
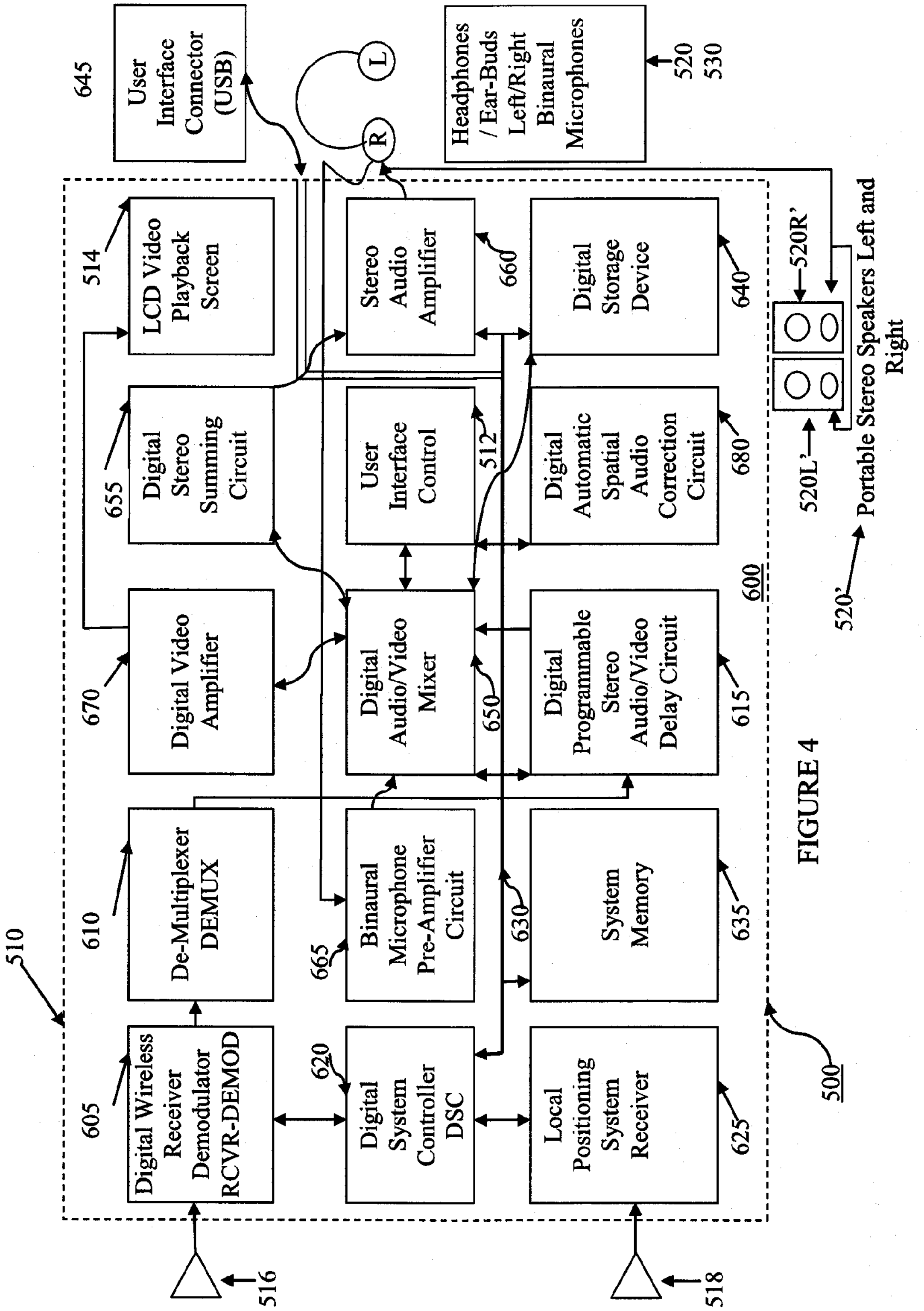
FIG. 4 is a schematic block diagram of an example embodiment of the personal receiver arrangement of FIG. 3.

FIG. 3 is a schematic diagram of an example personal receiver 500 useful in the example venue 100 of FIG. 1 and FIG. 4 is a schematic block diagram of an example embodiment thereof. Receiver 500 preferably includes a housing 510 containing the electronic circuitry, preferably digital circuitry, for receiving and processing signals transmitted from transmitters 220, 222, 230, and an audio reproduction device 520 such as a loudspeaker, ear phones, ear bud, ear mold, headphone, or another audio device or transducer, herein usually referred to as headphones, preferably having separate outputs 520L, 520R for reproducing left and right stereo audio. Left and right headphones 520L, 520R preferably each have a respective microphone 530L, 530R, e.g., binaural microphones 530, associated therewith for picking up the ambient sound at the user's ear regions, e.g., ambient sound in stereo. Binaural microphones 530 may be attached to headphones 520 or may be integrated therewith, as is usually preferred.

Housing 510 includes a control 512, e.g., a thumb ring, thumb wheel, control wheel, five-way rocker switch, or other input device, by which a user may input commands and/or data, and a display screen 514, e.g., an LCD or other display for text and/or graphics, by which information, data, graphics and/or video may be displayed for a user. Preferably, control 512 includes a thumb wheel which is designed to respond to thumb or finger rotation on an actuation surface and to pressure (depression) to activate and/or select audio and optionally video mixing and system controlling parameters for controlling audio and video functions of receiver 500. Typically, an electro-mechanical control wheel or thumb wheel 512 is mounted and set flush with housing 510 below or next to LCD display 514 of personal receiver 500.

Headphones 520 and binaural microphone 530 typically communicate with housing 510 via wires or cables 522L, 522R, or alternatively, via a wireless link, such as a Bluetooth or other link, preferably a digital wireless link, although an analog link can be employed. Where a digital communication link is employed, it would seem advantageous that such link be digitally encoded and/or access protected so that only authorized wirelessly-linked headphones 520 may be utilized with a given authorized receiver 500, as might be advantageous for preventing one receiver 500 for which authorization has been obtained to broadcast program data to plural wireless headphones, for all or some of which proper authorization has not been obtained.

Housing 510 includes electronic circuitry 600 therein that may collect and store:

(1) Preprogrammed data representing venue 100 in two and optionally in three dimensions (e.g., from 2-D and 3-D CAD drawings, plans and/or maps, or other digitized representation thereof, with or without acoustic properties and/or acoustic modeling of venue or space 100 and/or of any sound transducers 210, 212 therein), (2) Atmospheric data (temperature and optionally humidity and/or barometric pressure), (3) Location information relating to signals from corresponding transmitters 220X, 220Y, 230, 222X, 222Y, and/or other location finding devices, (4) Digital data, program data and authorization data from ones of transmitters 220, 222, 230, and (5) Binaural microphone signals from binaural microphones 530 placed on left and right listener headphones for their left and right ears.

Wireless signals are received at a receiving device, e.g., at antenna 516 and 518 where wireless RF transmission is employed. Receiver-demodulator 605 receives and demodulates the received wireless signals from antenna 516 which are de-multiplexed by demultiplexer 610 to extract the digital audio program data, and the optional digital video program data, which are communicated to programmable digital delay circuit 615 which delays the audio program data and the optional video program data by a programmable time determined, e.g., by controller 620. Circuitry 600 includes a digital clock for providing date and time data and for providing timing signals; and such digital clock may be provided by digital system controller 620 or by another element of circuitry 600.

Wireless locating signals may be received at a receiving device, e.g., at antenna 518 where wireless RF transmission is employed. Local positioning system (LPS) receiver 625 receives and decodes the received wireless locating signals which are communicated to controller 620. Receiver 625 may determine the location of personal receiver 500 by comparing the timing and/or phase of the received locating signals, or the relative arrival times thereof, or by triangulation, by a local positioning device, or by a global positioning system (GPS) system, or by any other suitable means. Digital controller 620 cooperates with receiver 625 for controlling receiver 625 and for receiving location data therefrom, and for determining the location of personal receiver 500 in venue 100, and its distance from the nearest of loudspeakers 210L, 210R, 212L, 212R in the example shown.

While separate antennas 516, 518 are illustrated, reception may be provided by any one or more antennas. Where antennas 516, 518 both receive signals that are relatively close in frequency, one antenna may be used for both functions. If beacon transmitters 220, X, 220Y and/or 230 were to transmit at substantially different frequencies, then separate antennas may be provided for receiving the X, Y and Z locating signals. In any case, antennas may be provided in receiver 500 is any suitable manner, e.g., on a headband associated with headphones 520, and separate antennas may be provided at the left and/or the right sides of headphones 520 and/or at housing 510, or wires 522L and/or 522R could serve as one or more antennas or antenna elements.

Controller 620 is preferably a digital system controller that processes received data and controls the elements of circuitry 600 via digital instructions and data communicated via digital data bus 630. Controller 620 may be a microprocessor, digital signal processor, or other digital control circuit, or another circuit having programmable and/or programmed calculating and logic functions, and may be a generic processor or a custom processor for receiver 500, as may be convenient and desirable. Instructions for operation of controller 620 may be programmed therein, e.g., in PROM or other permanent or re-programmable memory, or may be in whole or in part stored in cache memory 635 and/or in storage device 640 and read as needed.

Controller 620 may utilize venue drawing, plan and/or map data stored in system memory cache 635 (e.g., which may be RAM and/or PROM memory) and/or in digital storage device 640 (e.g., which may be a miniature hard drive or large capacity RAM where recording of the audio and/or video program is provided for) for determining the location. If the location of personal receiver 500 is within predetermined boundary 120 of venue 100, or is within a predetermined portion thereof, then controller 620 may enable circuitry 600 to receive, process and reproduce the audio program and optionally the video program. Data, e.g., pre-authorization data and venue plan/map data, and/or recorded program data, may be communicated to and from circuitry 600 via a user interface such as USB port 645 and data bus 630 under control of digital controller 620.

Receiver demodulator 605 may also communicate any received authorization data to controller 620 which processes such data for determining access rights authorized and for enabling and/or disabling elements of circuitry 600 in accordance with the authorization data. At the basic level, controller 620 verifies from an IP address or an ESN confirmation that reception of a broadcast program is permitted, and if so, enables receiver 605 and/or delay circuit 615 to process such program data. If not, controller 620 can block program data, e.g., either at receiver 605 or at delay circuit 615, and/or can block LPS receiver 625 from locating receiver 500 from transmitted locating signals. LPS receiver 625 may be activated for locating receiver 500 only when digitally time-stamped data packets contain data that has also been preprogrammed and pre-stored on storage device 640 of personal receiver 500, e.g., by the event proprietor or broadcaster. Time-stamped data packets may also be utilized to signal controller 620 to allow transmitted program content to flow through the various elements of personal receiver 500. Typically an IP address or other unique identifier for a particular receiver 500 would be permanently stored therein, e.g., in receiver 605, in controller 620, or in memory 635, in its manufacture and/or initial set up.

More complex authorizations may include combinations of authorizations and pre-authorizations for any particular event. In such case it may be necessary to program personal receiver 500 with a special per concert or special event "In Attendance Ticket Number." This concert or special event "In Attendance Ticket Number" would correspond to a ticket for the same concert or special event and/or to a seat number in a given concert or special event venue 100, ensuring that a user must also purchase a ticket to the concert or event where a payment and ticket is required for attendance and/or to use a receiver 500 at such event. A user would then have his "In Attendance Ticket" scanned upon arrival at the concert or event to obtain the ticket number thereof and also have his receiver 500 scanned by event personnel to obtain the identifying number thereof and the ticket number stored therein. If this scanned ticket number and receiver 500 information matches, it would be digitally stored and communicated to a broadcast programming computer, e.g., the computer of combiner 280, which compiles a list of valid "In Attendance Ticket Numbers" in attendance at venue 100. Upon activation prior to the concert or event, broadcast computer 280 will provide and transmitter 220 will transmit the compiled valid "Approved and In Attendance Ticket Numbers" authorization data.

Controllers 620 of personal receivers 500 receiving the digitally transmitted "Approved and In Attendance Ticket Numbers" authorization data will compare its own "In Attendance Ticket Number" from memory 635 with the received transmitted "Approved and In Attendance Ticket Numbers." If there is correspondence, system controller 620 will confirm that the appropriate authorization is present, and then will permit circuitry 600 to process the signals containing the transmitted program content (audio and/or video, as the authorization may be) of the concert or special event in accordance with the actual authorization. Optionally, the foregoing authorization and confirmation may also include obtaining and storing the identifying data (e.g., a unique serial number, an IP address and/or an ESN confirmation) for receiver 500 via USB port 645 when the ticket is procured, and further verifying correspondence of the stored receiver identity with that of the receiver 500 presented and scanned upon arrival at the concert or event.

The foregoing would allow the concert/event proprietor or operator to charge separate and distinct fees for different levels of access, e.g., for receiver 500 to receive the audio program (e.g., listen only, L+R stereo), for receiver 500 to receive a multi-track stereo audio program (e.g., listen and adjust only, upgrade from L+R stereo), for receiver 500 to receive the video program (e.g., view only), for receiver 500 to receive the audio and video programs (e.g., listen and view), for receiver 500 to record the stereo audio program, for receiver 500 to record the multi-track audio program, and/or for receiver 500 to record the video program. Whether to, e.g., view only, or to listen and/or view the program, to record the audio program, this sign up and or purchasing of programming may be executed prior to or during the broadcast event of said program or programs.

In addition, the time period for which a personal receiver 500 is activated responsive to authorization signals may be controlled either by requiring periodic re-authorization from re-transmitted authorization codes or by a programmed time, as might be included in the ticket number data. It is noted that data transmitted to personal receiver 500 is typically and preferably in a digital format, such as digitally time stamped data packets. Controller 620 is programmed to respond to and decode such data packets and the information contained therein. Pre-programmed time data packets may also signal controller 620 in a receiver 500 to shut down all processing when a time window for program reception has expired for a particular program or concert.

When controller 620 enables operation, LPS receiver 625 computes its physical location, optionally including elevation, with respect to a predefined venue 100 for a concert or special event, and may periodically re-compute its location, e.g., by comparing its real time computed location against a pre programmed 2 or 3 dimensional CAD drawing/map of venue 100 which typically is stored in memory storage device 640.

Personal receiver 500 then compares its computed location relative to the CAD drawing/map of venue 100 relative to the distance and elevation of receiver 500 from the pre-programmed loudspeaker locations stored as part of the CAD drawing/map of venue 100, e.g., the locations and acoustical characteristics of the loudspeakers may be represented therein providing in effect a virtual acoustical model or representation thereof. Loudspeaker location information of the CAD drawing/map typically includes 2 or 3 dimensional information relative to loudspeaker 210, 212 locations within venue 100, speaker coverage area of each loudspeaker 210, 212, designations of any type or part of the audio program being reproduced by each loudspeaker 210, 212, each of which may include left, right, left rear, right rear, sub-bass, center-channel, front or mono, and/or rear or mono audio program tracks, whether direct or delayed, e.g., in a stereo, quadraphonic and/or surround sound arrangement.

Personal receiver 500 then computes therefrom the distance and elevation to each loudspeaker 210, 212 in venue 100, and determines the distance receiver 500 is from the nearest left and right loudspeakers 210, 212, or from greater volume loudspeakers 210,212 relative to the actual acoustical sound field at the location of receiver 500. This determination may be generalized or may take into account the various channels of audio reproduced by the various loudspeakers, such as stereo audio, quadraphonic audio and/or 4.1, 5.1, 7.1 or greater surround sound. Receiver 500, and specifically controller 620, then determines the electronic signal delay or delays to be applied to the wireless broadcast program from receiver 605 and demultiplexer 610 for the purpose of reproducing the broadcast wireless audio program in earphones 520 in relative synchronization with the audio heard from loudspeakers 210, 212 in the acoustical listening area of receiver 500, thereby to enhance the audio program for the listener/user of receiver 500, e.g., by a common delay time and/or by specific delay times relating to the various channels or tracks of audio program data.

It is noted that both left and right stereo audio channels (or plural track audio, or quadraphonic and/or surround sound audio) can be delayed by the same time, e.g., the propagation time from the nearest loudspeaker 210, 212, as is the typical implementation, however, the left and right stereo audio channels (or left and right channel plural track audio and/or quadraphonic and/or surround sound audio) can be delayed by different times, e.g., the left channel stereo audio (left channel plural track audio or quadraphonic and/or surround sound audio) may be delayed by the propagation time from the nearest left channel loudspeaker 210L, 212L, and the right channel stereo audio (right channel plural track audio or quadraphonic and/or surround sound audio) may be delayed by the propagation time from the nearest right channel loudspeaker 210R, 212R, thereby to provide even more precise time alignment of the left and right channel audio (or plural track audio, or quadraphonic and/or surround sound audio) as reproduced by receiver 500 with the natural left and right channel natural sound arriving from the closest left channel loudspeakers 210L, 212L and right channel loudspeakers 2108, 212R, respectively.

Substantially simultaneously, controller 620 receives local atmospheric data relative to venue 100 as transmitted by one or more of transmitters 220, 222, 230, either from receiver demodulator 605 or from demultiplexer 610 (e.g., via delay circuit 615). Controller 620, or alternatively programmable digital delay circuit 615, utilizes the received current atmospheric data to compute the actual speed of sound in venue 100, and from the computed actual speed of sound and the distance to the nearest loudspeaker 210, 212, computes the time required for sound to propagate from the nearest loudspeaker 210, 212 to receiver 500.

The signal delay computed represents the stereo audio delay needed to be applied at individual stereo earphones 520 to align in time the broadcast program from transmitters 220, 222 and the natural sound as propagated from "virtual" loudspeakers through the air in venue 100, which is a true representation of the real physical loudspeakers 210, 212 within venue 100 determined from the determined location of receiver 500 within the 2 or 3 dimensional venue 100 and the computed actual speed of sound in venue 100 relative to atmospheric data at that given time. Because the space 120 may be represented by drawings and/or maps and/or plans stored in memory 635, and/or storage device 640, e.g., and so can be considered a virtual space, individual loudspeakers may be represented by their respective locations in space 120 and by their respective acoustical/sound reproduction characteristics, whereby the loudspeakers may be represented as virtual loudspeakers (sound transducers) in the virtual space represented by the stored drawings and/or maps and/or plans.

Programmable digital signal delay circuit 615 applies the computed delay time to audio program data and optionally to data and video program data, thereby to obtain substantial time alignment between the reproduced audio (and optionally video) broadcast program at headphones 520 and the natural sound from the nearest of loudspeakers 210, 212. The determined delay time is stored, e.g., in delay circuit 615 or in memory 635 or both, and may be retrieved as needed. As the location of receiver 500 is periodically determined, and/or as the actual atmospheric data may change, processor 620 recalculates the appropriate delay time and updates delay circuit 615, so that the time alignment is maintained as the user may move around in venue 100 and as the local weather may change.

It is noted that the delay time for video data is typically the same as the delay time for audio data, e.g., by selecting the shortest delay time computed for either left channel or right channel audio with respect to the nearest loudspeaker 210, 212 as described above. Thus, the same delay will delay the video data so that the video display will be in synchronism with the delayed audio data as reproduced in headphones 520. Further the same delay will typically be applied to the data transmitted, if any.

It is also noted that while it is generally satisfactory to delay all channels and/or tracks the audio by the same delay time determined with respect to the nearest loudspeaker 210, 212, different channels and/or tracks may optionally be delayed by different times so that, e.g., left channel stereo audio may be delayed by a time determined relative to the nearest loudspeaker 210L, 212L reproducing left channel audio sound and right channel stereo audio may be delayed by a time determined relative to the nearest loudspeaker 210R, 212R reproducing right channel audio sound. As a result, both audio channels would be reproduced in the respective earphones of headset 520 substantially simultaneously with the natural sound arriving for the respective left and right channel loudspeakers 210L, 210R, 212L, 212R. Further, such different delay times may likewise be determined and applied with respect to the audio channels of stereo sound, quadraphonic sound and/or surround sound, as the case may be.

Programmable digital delay circuit 615 includes sufficient memory, e.g., RAM, shift registers, and the like, to store audio data, text data, and/or video data for a time that is at least the maximum anticipated delay for a venue 100. If receiver 500 is for use in a theater or arena venue, then the time delay will likely be 200 milliseconds or less and so the required memory capacity is quite modest. If receiver 500 is for use in a large outdoor venue, then the time delay could approach three seconds and so the required memory capacity is substantial. Digital delay circuit 615 includes memory for at least two channels of audio, e.g., stereo audio, and may accommodate plural track, e.g., six or eight track, audio, and may include memory to store several or many fields or frames of video data, e.g., up to 90 fields for a large venue. It is noted that because display 514 is relatively small, e.g., an about 2 inch by 3 inch or smaller LCD display, low resolution video would be satisfactory and the required memory capacity could be reduced accordingly. If it were desired to store full resolution video, however, then video data could be stored on a miniature hard drive such as storage device 640.

In the alternative venue arrangement wherein transmitters 220X, 220Y are associated with loudspeakers 210L, 210R, respectively, and broadcast the program audio associated with that particular loudspeaker, and/or wherein transmitters 222X, 222Y are associated with loudspeakers 212L, 212R, respectively, and broadcast the delayed program audio associated with that particular auxiliary loudspeaker, receivers 500 may select the program audio broadcast by the transmitter 220X, 220Y, 222X, 222Y associated with the ones of left and right loudspeakers 210L, 210R, 222L, 222R that it has determined are nearest, and so need only delay the program audio and/or video therefrom by a time determined from the actual speed of sound and the distance to the nearest speaker or speakers, thereby reducing the delay time needed and the capacity of the receiver 500 delay circuit that stores the program audio and/or video for that delay time.

Digital Audio/Video Mixer 650 receives plural tracks of delayed audio data and optionally receives delayed video data from digital delay circuit 615 and provides facilities for user control of the audio program and optionally the video program. Audio/video mixer 650 is controlled by user interface 512, e.g., via a electro-mechanical control wheel or thumb wheel 512, and also communicates inputs from control 512 via data bus 630 to processor 620 and optionally to others of elements 615-680. Mixer 650 may be implemented by computer instructions (software) controlling a digital processor or by a special purpose integrated circuit.

Mixer 650 responds to user inputs from user interface control 512 for allowing the user to adjust reproduction of the audio program, including, e.g., audio volume, audio dynamics, tone, and/or equalization of at least two stereo audio channels, and optionally plural tracks of stereo audio, of the wireless broadcast audio program in headphones 520. Such control 512 may be exercised, e.g., separately as to each channel of the stereo audio as reproduced by headphones 520 and/or as recorded by storage device 640, as to each track of plural track program audio as reproduced by headphones 520 and/or as recorded by storage device 640, and/or as to the optional program video as reproduced by display 514 and/or as recorded by storage device 640, as may be enabled in the manufacture and/or programming of receiver 500 and/or as desired by a user.

User control 512 also allows a user to input commands and/or data for controlling and/or adjusting the functions, features and other operation of personal receiver 500 that are user controllable and/or adjustable. For example, optionally, user interface control 512 also allows user selection and control of display 514 including when display 514 is utilized as a video screen 514, e.g., for displaying and not displaying the video program, for adjusting, color and/or tint, brightness, contrast, sharpness, and the like.

Digital/Audio Mixer 650 provides mixed audio signals/data, which may be stereo audio or plural-track audio, to stereo audio summing circuit 655 which combines the various audio channels and/or tracks, e.g., by summing or by a more complex function, into left and right channel stereo digital audio which is provided to amplifier 660 which amplifies and applies the left and right channel stereo audio to the left and right speakers, respectively, of headphones 520 and/or to optional left and right portable stereo speakers 520L', 520R', which may be separate speakers or may be contained in housing 510. Amplifier 655 may include digital stereo amplifiers followed by respective digital-to-analog (D/A) converters or may include an digital-to-analog (D/A) converter followed by analog stereo amplifiers, as desired.

Mounted to or on or nearby the respective left and right speakers of headphones 520 are a pair of binaural microphones 530 for picking up the ambient sound proximate the respective ears of a user wearing headphones 520. Signals from left and right microphones 530L, 530R of binaural microphone 530 are respectively amplified and digitized by binaural microphone pre-amplifier circuit 665 which may preferably include analog pre-amplifiers followed by an A/D converter, but which may include A/D converters followed by digital amplifiers. Amplified binaural (stereo) ambient sound data from pre-amplifier 665 is coupled to digital audio/video mixer 650 wherein it may be adjusted in level and/or mixed with the stereo audio and/or plural track audio data from delay circuit 615. Mixer 650 may adjust the level of ambient sound either according to a pre-determined adjustment and/or in response to user inputs via user control 512.

Because the ambient sound includes program audio that is delayed in propagating through the atmosphere from loudspeakers 210, 212, the binaural ambient sound and the audio program sound from the wireless broadcast delayed by delay circuit 615 are substantially in time alignment at the output of mixer 650, and as reproduced by headphone 520. It is noted that the ambient sound picked up by binaural microphones 530 is employed to introduce ambient sound into what the user hears at headphone 520, and not to determine a time delay to be applied to time align the wirelessly broadcast program audio with the natural sound.

This arrangement allows compensation for the attenuation of the ambient sound inherent in using headphones, ear buds and similar speakers 520 that reduce the level of ambient sound reaching the ear, either automatically or in response to user inputs via control 512, and also allows for automatic adjustment of the reproduced audio at headphone 520. A user may use control 512 for adjusting the respective levels of the program audio as received via the wireless broadcast and of the ambient sound as reproduced from binaural microphones 530 so as to hear a desired (subjective) pleasing combination thereof, e.g., of the relatively "pure" wireless program audio and of the natural sound at the user's location in venue 100. This allows for customization according to individual preferences, e.g., where one person might prefer to emphasize the wireless program audio over the ambient sound, and where another person might prefer to amplify the ambient sound to overcome the attenuation of headphones 520 while hearing the wireless program audio at a lower level. It also allows a user to set a level wherein conversation of nearby people picked up by microphones 530 can be heard via headphone 520 and conversation conducted, if desired.

This arrangement also allows system/circuit 600 to automatically determine the relative ambient sound pressure (including audio from loudspeakers 210, 212 and other sounds) from the levels of the signals produced by binaural microphones 530 (as representative of that being heard by each ear of the listener), to then reproduce the synchronized wireless audio program and the binaural microphone sound (which are in synchronism (time alignment) with sound produced by near ones of loudspeakers 210, 212 by operation of delay circuit 615) at respective levels approximating the sound pressure level of the ambient sound/loudspeaker sound in the user's location in venue 100, subject to any adjustment a user might make using control 512. Thus an automatic volume control feature may be provided so that the level of audio reproduced by headphones 520 is increased and decreased automatically as the level of the ambient sound increases and decreases, thereby to reduce the likelihood of local noise interfering with enjoyment of the event. So as to naturally blend in the wireless transmitted program sound and binaural (local sound) with the sound emitting from said loudspeakers for listener of personal receiver.

User control 512 may also be employed to adjust, if desired, the basic dynamics of binaural microphones 530 and signals from microphones 530 may be blended by mixer 650 into the left & right stereo summer 655 output of the left & right wireless audio broadcast, if desired, and may control recording of binaural microphone 530 signals, wireless program audio, and optional video, to audio/video storage device 640, including storing program audio as individual audio tracks for re-mixing, re-recording and playback at a later time, might be desired, e.g., for receiver 500 serve as a Karaoke device.

The video output from digital audio/video mixer 650, if available and authorized may be provided to digital video amplifier 670 which amplifies and conditions the video signals as required for display on display 514 or on a separate LCD video monitor playback screen. Thus the performance/program may be viewed on display 514 in time alignment with the program audio sound as reproduced by loudspeakers 210, 212, by headphones 520, and/or by portable speakers 520'.

Mixer 650 and digital storage device 640 are interconnected so that audio data (wireless program audio, plural track audio, and/or binaural microphone 530 audio) and optionally video program data produced by mixer 650 may, if authorized, be recorded on storage device 640. Further, audio data (wireless program audio, plural track audio, and/or binaural microphone 530 audio) and video program data stored on storage device 640 may, if authorized, be played back from storage device 640via audio/video mixer 650. Played back audio and/or video may be reproduced via headphones 520, portable speakers 520' and display 514, as applicable, and/or exported via interface 645 to a suitable external device, such as a stereo or other system, video display, computer, video player, and the like, to the extent such is authorized. Thus the performance/program may be heard and/or viewed on an external device as may be convenient and desirable.

Typically, the function of recording program audio and/or video must be enabled by an event operator or broadcaster and be programmed into personal receiver 500, usually in advance of a concert or event, e.g., by the operator or broadcaster thereof transmitting authorization data to systems controller 620 via USB interface 645 or by wireless transmission via receiver 605. Typically, authorizations are verified by controller 620 checking the authorization data against receiver 500 data stored in memory cache 635, e.g., an IP address or ESN confirmation, before program audio and/or video can be recorded by receiver 500, e.g., on storage device 640. Moreover, the wireless transmitter at the concert or event preferably broadcasts digital data packets to personal receivers 500 in real time at the concert or event to enable the properly authorized personal receivers 500 to record an event, a particular song and/or an entire program, in accordance with the authorization, and other receivers 500 without proper authorization data stored therein will be unable to record.

Upon the approval by an operator or broadcaster of one or more authorizations of rights granted for a personal receiver 500 to record a performance, the record program function of circuitry 600 will be enabled by system controller 620, and a user must then select the approved record program function by selecting the appropriate audio and/or video channels and/or data/tracks that will be produced by mixer 650 for recording by digital storage device 640. Thereafter, a user may recall and/or reproduce the recorded audio/video data and/or tracks for re-mixing, reproduction and playback and re-recording at a later time, or may download same via USB interface 645.

Various recording options may be provided for recording program audio and/or video, e.g., in storage device 640, responsive to user inputs via control 512 and/or to authorization data whether pre-loaded via interface 645 or received wirelessly via receiver 605. For example, receiver 500 may record the stereo program audio (preferably delayed for time alignment), plural track program audio (preferably delayed for time alignment), stereo ambient sound from binaural microphones 530, text, and/or program video (preferably delayed for time alignment). Each can be recorded as separate tracks, e.g., stereo audio as two tracks, plural track audio as a like number of tracks, binaural natural sound as two tracks, which would allow the user to later create, reproduce and record re-mixes and custom mixes in accordance with any applicable authorizations, and each of the foregoing may be recorded in its original form, as modified by user inputs, and/or as mixed in real time in response to user inputs.

In the foregoing circuit 600, data and instructions are communicated via digital data bus 630 among programmable digital audio/video delay circuit 615, digital system controller 620, system memory 635, digital storage device 640, USB or other user interface (connector) 645, digital audio/video mixer 650, digital/analog stereo audio amplifier 660, and digital automatic spatial audio correction circuit 680, and each of the foregoing includes appropriate input/output (I/O) circuitry as needed. The functions controllable by instructions and/or data communicated via data bus 630 may include any or all of audio volume, automatic volume control, stereo balance, audio track combination and weighting, audio program mixing, tone, binaural microphone 530 feed through, video display, audio recording and playback, video recording and playback, and the like.

It is noted that a substantial part of the function of receiver 500 including that of circuitry 600 thereof may be provided by a personal electronic device, such as a personal digital assistant (PDA), mobile phone, Blackberry device, MP3 player, iPod device, iPhone device, satellite radio receiver, and the like, with the remainder of circuitry 600 being provided in a housing 510 that serves as a docking station for the personal electronic device, so that the combination of the docking station and the personal electronic device comprise personal receiver 500.

Figure 5A:
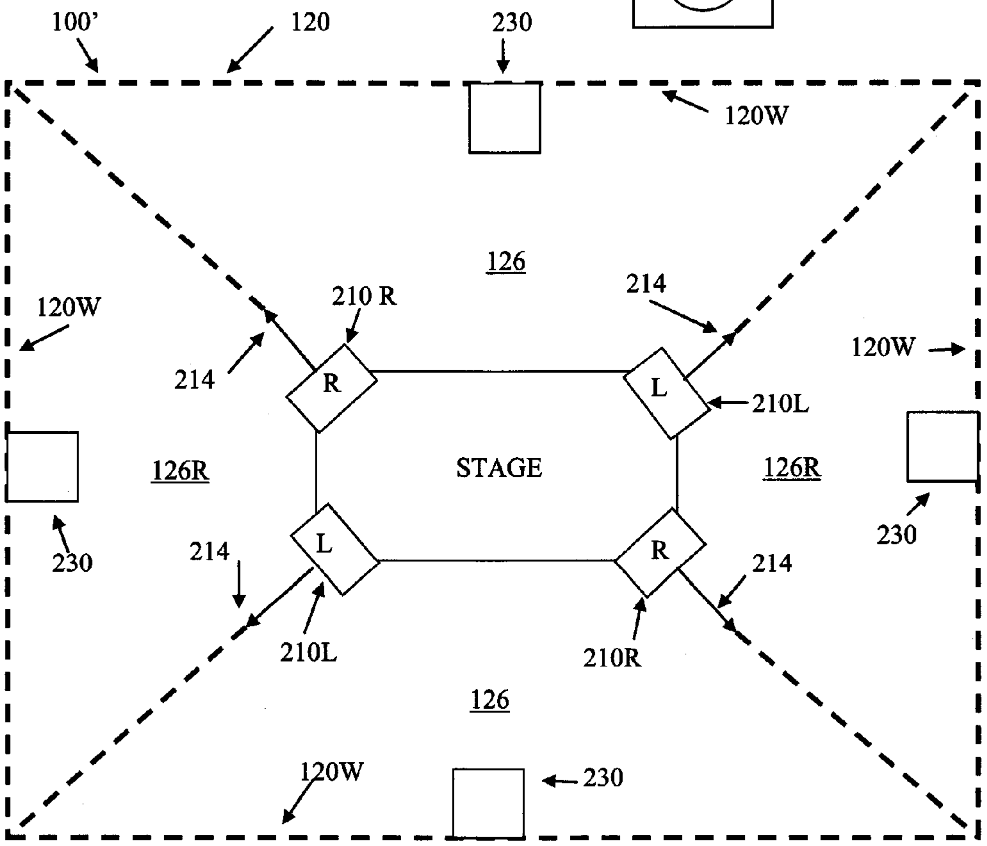
FIGS. 5A and 5B are schematic diagrams of plan and elevation views, respectively, of an example arena venue wherein sound is propagated from plural audio sources to a reception region.
Figure 5B:
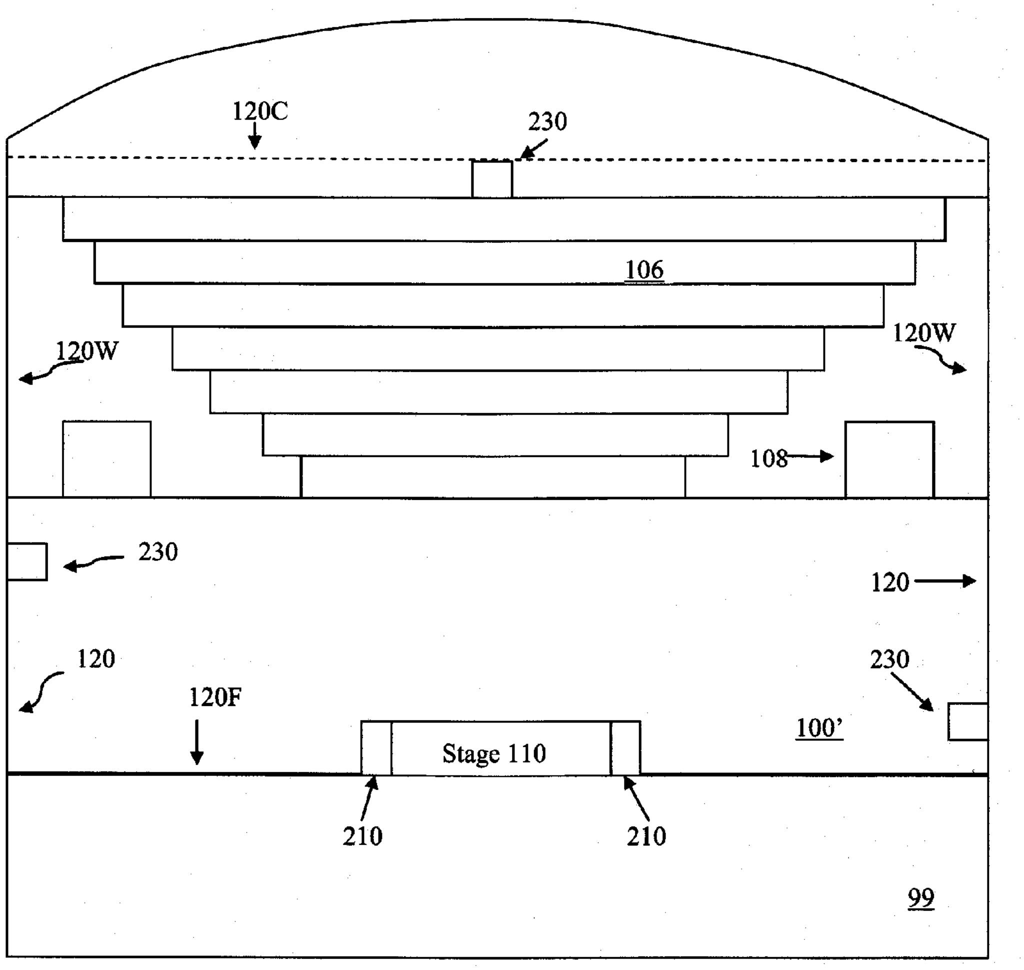

FIGS. 5A and 5B are schematic diagrams of plan and elevation views, respectively, of an example arena venue 100' wherein sound is propagated from plural audio sources 210 to a reception region 120. Boundary 120 defines the space 120 within which the performance on stage 110 may be viewed and/or listened to using a personal receiver 500 as described above. Particular boundaries of space 120 are defined by floor 120F, four walls 120W and ceiling 120C, and admission into space 120 would typically be ticketed and controlled at a limited number of gates and/or access locations. Below venue 100" is space 99 in which personal receivers 500 should not be operated, e.g., either because access is not ticketed and controlled or because another event is being held there. While venue 100' is illustrated as being generally symmetrical, and with stage 110 relatively centrally located, neither is necessary for the description following.

At each corner of stage 110 is a loudspeaker 210 arranged to project sound about an axis extending therefrom in directions indicated by the diagonal arrows and dashed lines 214. Such speakers typically have an about 135° dispersion so as to cover venue 100' with audio from, e.g., the performance on stage 110. Alternate ones 210L of speakers 210 reproduce left channel audio and the others 210R reproduce right channel audio. As a result, the audience in areas 126 facing stage 110 receive amplified left channel audio from loudspeaker 210L to their left front and receive amplified right channel audio from loudspeaker 210R to their right front, and so the stereo phasing is correct and reproduction is normal. However, the audience in areas 126R facing stage 110 receive amplified left channel audio from loudspeaker 210L to their right front and receive amplified right channel audio from loudspeaker 210R to their left front, and so the stereo phasing is and its reproduction are reversed.

While this phase reversal in area 126R may be tolerable to some, it can become quite unsatisfactory when a wireless receiver (not personal receiver 500) is utilized for listening to wirelessly transmitted program audio, because the left and right wireless audio is in correct phasing and so when combined at a listener's ear with natural sound which is reverse stereo, the two tend to cancel each other and monaural sound is heard.

Personal receiver 500 includes a function that tends to avoid such cancellation and loss of stereo effect. Because receiver 500 determines its location within venue 100' from locating signals transmitted by plural transmitters 230, it can detect when it is in a reverse stereo area 126R and can reverse the phasing of the wireless audio program it reproduces in the left and right speakers of headphone 520. The locating signal transmitted by each transmitter is unique to that transmitter 230, e.g., by frequency or by data therein, so that which signal originated at which transmitter 230 is known so that the location of receiver 500 within area 120 of venue 100' may be uniquely determined. Receiver 500 typically selects the three (or four, as appropriate) from the nearest transmitters 220, 230 from which to determine its location, which may be within boundary 120 or may be outside of boundary 120. Optionally, receiver 500 may be programmed, e.g., by authorization data, including location authorization data, for disabling some or all of its functions if it determines its location to be outside of boundary 120.

In venue 100' transmitters 230 are located around the periphery of space 120, e.g., on walls 120W. Preferably at least four transmitters 230 are employed and are located so that all are not in the same plane. For example, two or three of transmitters 230 may be on walls 120W at the same or different elevations, and the remainder of transmitters 230 may be located in an elevated location, such as in balcony or upper deck 106. Receiver 500 receives locating signals from transmitters 230 and therefrom determines its location within boundary 120 of venue 100'. The arrangement wherein receiver 500 stores drawings and/or plans of venue 100', e.g., in a 2-D or 3-D CAD format, is useful for determining the location of receiver 500 in two dimensions (2-D) or in three dimensions (3-D), so that elevation of receiver 500' is determined as well as its north-east-south-west (NEWS) location, and the distances to the nearest left and right loudspeakers 210L, 210R. Therein the drawing/map data preferably includes an acoustical layout for all of loudspeakers 210, 212 so that the distance to the nearest loudspeaker 210, 212 is to one directing sound towards that location and not one directing sound away from that location.

The NEWS location data for receiver 500 may be employed to enable a receiver 500 only when it is within the walls 120W, so that it is enabled within space 120 and is disabled when outside thereof, e.g., outside of the walls 120W of the building. The location elevation data for receiver 500 may be employed to enable a receiver 500 only when it is between the elevations of floor 120F and ceiling 120C, so that it is enabled within space 120 and is disabled when outside thereof, e.g., in space 99 below venue 100', thereby avoiding eavesdropping and surreptitious listening, viewing and/or recording. Using both NEWS and elevation location data, receiver 500 may or may not be enabled in corridor 108 depending upon whether corridor 108 is defined to be within space 120 or outside thereof.

When the location of receiver 500 is determined to be in a reverse stereo area 126R, e.g., by positioning system receiver 625 and processor 620, automatic spatial audio correction circuit 680 of circuitry 600 of FIG. 4 operates to reverse (interchange) the left and right stereo audio channels received by wireless transmission so that the wireless program audio reproduced by headphones 520 and/or speakers 520' so that it is of like phasing with the natural audio sound from loudspeakers 210R, 210L, albeit with reverse stereo phasing. In the simplest case wherein transmitter 230 is located a relatively symmetric central location in an area wherein the stereo phasing is known, e.g., at the rear center of area 126 or 126R, the stereo phasing can be represented by data in the signals transmitted thereby, and that stereo phasing data may be used by spatial correction circuit 680 of receiver 500 for correcting the stereo phasing when receiver 500 is in area 126R.

Spatial audio correction circuit 680 may interoperate with any of several other elements of circuitry 600 to properly reverse the phasing of the wireless program audio when receiver 500 is located in a reverse stereo area 126R. For example, correction circuit 680 may receive the de-multiplexed audio channels and/or tracks data from de-multiplexer 610 and adjust the spatial audio image thereof to match that being heard in the user's listening field from loudspeakers 210, then returning the corrected audio channels and/or tracks to delay circuit 615. Alternatively, spatial correction circuit 680 could receive delayed program audio from delay circuit 615 and apply the appropriate correction thereto before sending it on to mixer 650. Alternatively, spatial correction circuit could control demultiplexer 610, delay circuit 615, mixer 650, or any combination thereof to perform the correction on the program audio data as such data is processed by one or more of those elements 610, 615, 650. It is noted that spatial correction should be made prior to the mixing of wirelessly broadcast program audio with ambient sound, e.g., from binaural microphone 530, so as to maintain the stereo effect.

In venue 100', each wireless transmitter 230 transmits locating data and all are synchronized for accuracy in receivers 500 determining their respective locations, however, not all of wireless transmitters 230 need transmit program audio and/or video data, atmospheric data, and/or authorization data, so long as coverage within space 120 is complete. In addition, one or more wireless transmitters may be co-located with loudspeakers 210 in similar manner to that described above in relation to venue 100', as described below. Further, additional and auxiliary loudspeakers 212 may be employed in venue 100' to be taken into account in determining the locations of receivers 500 and the appropriate delay times for time aligning the wireless program audio with the natural sound from the nearest loudspeaker or loudspeakers.

Alternatively, e.g., in the case where venue 100' is generally symmetrical, or is at least not irregular, the locating process for receivers 500 may be simplified in that the described comparison with detail drawings and/or maps may not be necessary. Because the locations of normal stereo phasing areas 126 and of reverse stereo phasing areas 126R are known in advance, as are the locations of transmitters 230, the ones of transmitters 230 that are located in normal stereo areas 126 may transmit signals including an indication that stereo phasing is normal and the ones of transmitters 230 that are located in reverse stereo areas 126R may transmit signals including an indication that stereo phasing is reversed, so that proximity to a given transmitter 230 would be sufficient to determine whether spatial audio correction circuit 680 should or should not reverse the stereo phasing within receiver 500. In such case, location positioning system receiver 625 and/or controller 620 may determine location from locating signal timing and/or phasing or other suitable means.

Figure 6:
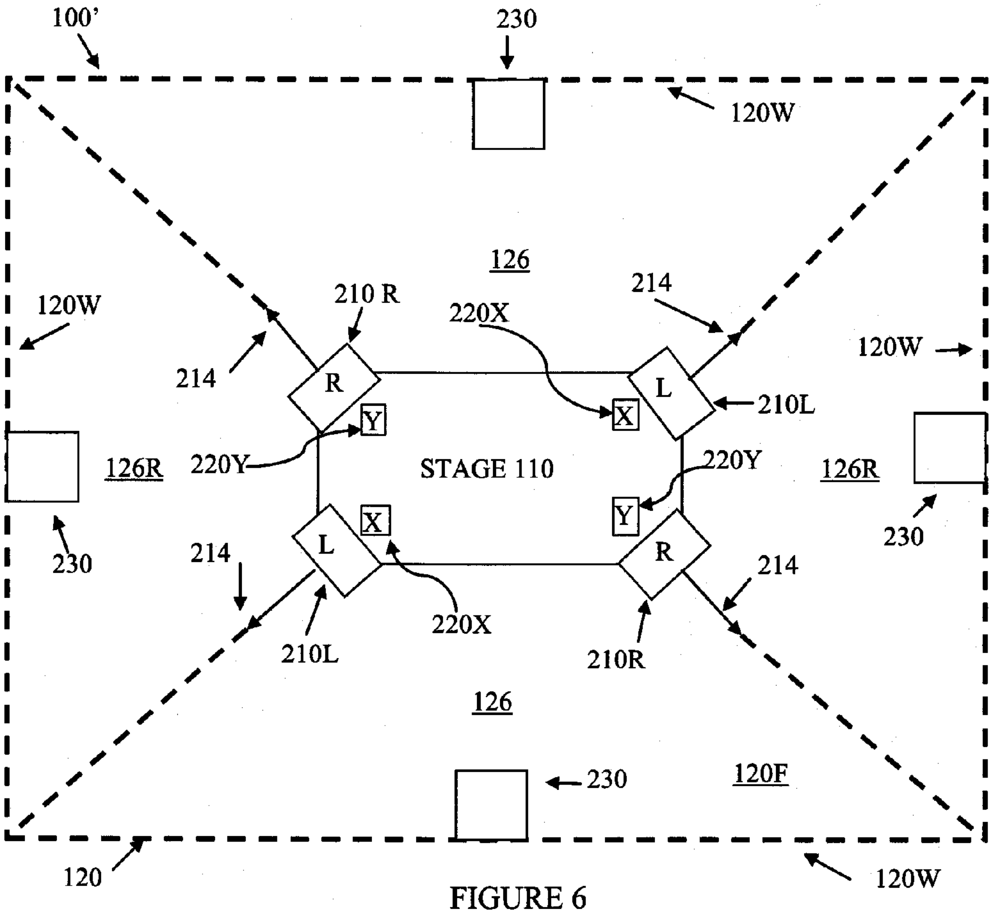
FIG. 6 is a schematic diagram plan view of an example arena venue wherein sound is propagated from plural audio sources to a reception region employing an alternative wireless transmitter arrangement.

FIG. 6 is a schematic diagram of example arena venue 100' wherein sound is propagated from plural audio sources 210 to a reception region 120 wherein an alternative arrangement of wireless transmitters 220X, 220Y, 230 are employed. Venue 100' is as described above except that an additional wireless transmitter 220X is co-located with each left channel loudspeaker 220L and an additional wireless transmitter 220Y is co-located with each right channel loudspeaker 220R.

Each of wireless transmitters 220X, 220Y, 230 may be controlled so as to transmit a relatively weaker signal so as to cover only a portion or zone of venue 100', in which case, sets of wireless transmitters 220X, 220Y, 230 may sufficiently cover respective portions of the space within boundary 120. For example, the wireless transmitters 220X, 220Y located at adjacent corners of one edge of stage 110 may be associated with the wireless transmitter 230 mounted on the wall 120W closest that edge of stage 110 and operate as a set for providing signals for locating receivers 500 in that portion of space 120 and for providing other functions of receivers 500 therein. Typically, wireless transmitters 220X, 220Y, 230 could be associated into four sets in the example venue 100' that generally correspond to the four edges of stage 110 and the four stereo zones 126, 126R adjacent such edges, with each set providing coverage that extends beyond its associated stereo zone 126, 126R. This overlap in the respective coverage regions of adjacent sets of wireless transmitters 220X, 220Y, 230 is utilized by receivers 500 which determine which of the plural wireless transmitter signals to utilize in determining location, in selecting the loudspeakers 210 that are closest, in correcting stereo phasing, and in enabling and/or disabling other features of receivers 500.

In this arrangement for venue 100', the operation of wireless transmitters 220, 230 and of the locating of receivers 500 may be similar to that described above in relation to venue 100 and/or venue 100', and automatic correction of reversed stereo phasing may also be provided as described above. Thus, personal receivers 500 may be utilized in different venues 100, 100' wherein different features, such as receiver locating, selective authorizations for recording and the like, and/or automatic correction of stereo phase reversal may be included or not as may be desired.

Figure 7A:
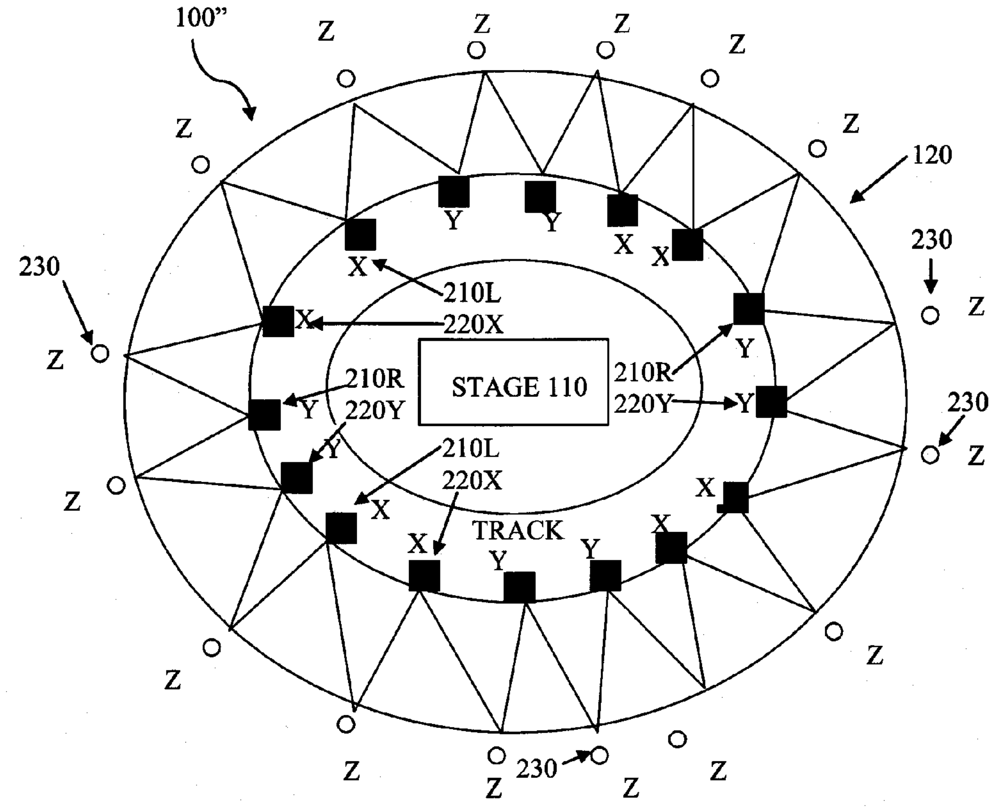
FIG. 7A is a schematic diagram plan view of a different example arena venue wherein sound is propagated from plural audio sources to a reception region.
Figure 7B:
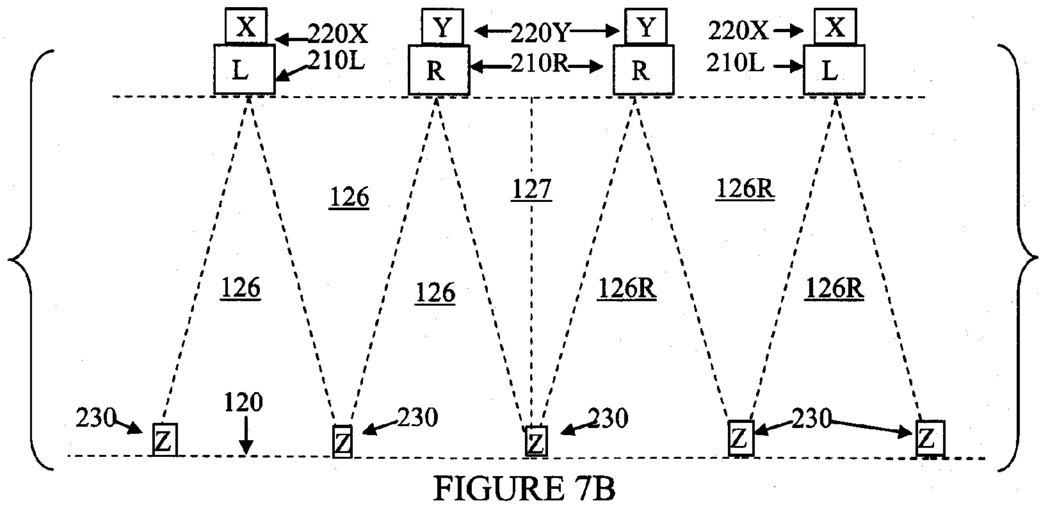
FIG. 7B is a schematic diagram of a portion of the example arena venue of FIG. 6.

FIG. 7A is a schematic diagram plan view of another example arena venue 100" wherein sound is propagated from plural audio sources 210L, 210R to a reception region 120, and FIG. 7B is a schematic diagram of a portion of the example arena venue 100" of FIG. 7A. Venue 100" represents a large arena-type or stadium-type venue wherein many sets of loudspeakers 210 surround a generally centrally located stage 110 or an off-center stage 110. Loudspeakers 210 therein alternate between those 210L reproducing left channel stereo sound and those 210R reproducing right channel stereo sound. For better coverage of loudspeaker sound, loudspeakers 210L and 210R may be grouped in pairs as illustrates so as to have a wider angle of sound projection than is provided by a single loudspeaker 210L, 210R. Pairs of loudspeakers 210L and 210R are generally relatively close together with greater spacing between adjacent left and right channel speakers 210L, 210R.

Typically, wireless transmitters 220X, 220Y are co-located with associated left and right channel loudspeakers 210L, 210R, respectively, and other wireless transmitters 230, 230Z are located around the periphery 120 of venue 100". Preferably transmitters 230 are located near the rear of the space 120 and relatively symmetrically with respect to left and right loudspeakers 220L, 220R, so as to facilitate the determination of location and stereo phasing by receivers 500. Typically, wireless transmitters 220X, 220Y, 230Z, or sets thereof, cooperate for providing synchronized locating signals for personal receivers 500 within space 120 to utilize for determining their respective locations therein, for appropriately delaying wirelessly broadcast program audio, for automatically correcting for reversed stereo phase, and for enabling/disabling various features of receivers 500, all as described above.

As best seen in FIG. 7A, the arrangement of loudspeakers 210L, 210R results in areas 126 of space 120 wherein the phasing of the natural stereo audio sound is normal and areas 126R of space 120 wherein the phasing of the natural stereo audio sound is reversed. When a personal receiver 500 determines that it is located in an area 126, the wirelessly transmitted left and right program audio is reproduced in the left and right speakers 520L, 520R of headphones 520 with normal phasing. When a personal receiver 500 determines that it is located in an area 126R of reverse stereo phasing, the wirelessly transmitted left and right program audio is reproduced in the left and right speakers 520L, 520R of headphones 520 with reversed phasing, so that a stereo effect is maintained.

Areas 127, however, provide a somewhat different natural sound situation in that proximity to two right channel loudspeakers 210R will cause the right channel natural sound to predominate over the left channel natural sound from more distant left channel loudspeakers 210L, and so the stereo effect may be diminished. Because receiver 500 may include an automatic volume control feature responsive to the natural ambient sound as picked up by left and right binaural microphones 530L, 530R as described above, the respective volumes of the ambient natural sound from the left and right microphones 530L, 530R may be automatically adjusted, e.g., to increase the volume in left speaker 520L thereof and to decrease the volume in right speaker 520R thereof, so that the levels of the left and right reproduced ambient natural sound tend to be more in balance and tend to offset any imbalance in the left and right channel natural sound that may be perceived around headphones 520. Thus, that perception of stereo audio may be improved.

Alternatively, the respective volumes of the wirelessly broadcast left and right channel program audio as reproduced in left and right speakers 520L, 520R, respectively, of headphones 520 may be automatically adjusted, e.g., to increase the volume in left speaker 520L thereof and to decrease the volume in right speaker 520R thereof, so that the levels of the left and right reproduced program audio tend to compensate for the imbalance in the left and right channel natural sound, and that perception of stereo audio may be improved.

In any case, the wireless program audio is delayed to be in time alignment with the natural sound from the nearest loudspeaker 210 based upon actual atmospheric conditions and the actual speed of sound, and the left and right channels thereof may advantageously be delayed by different times so that the left channel program audio is in time alignment with the left channel natural sound from loudspeaker 210L and the right channel program audio is in time alignment with the right channel natural sound from loudspeaker 210R. If receiver 500 determines that it is located in area 127 relatively closer to area 126, the wirelessly broadcast program audio is reproduced in headphones 520 with normal stereo phasing, and if receiver 500 determines that it is located in area 127 relatively closer to area 126R, the wirelessly broadcast program audio is reproduced in headphones 520 with reversed stereo phasing, as described above.

A wireless personal receiver 500 for reproducing program data including stereo audio data originating from a source in a venue 100, 100', 100" having a boundary 120 and plural sound reproducing transducers 210, 212 therein, may comprise: a receiver 605 for receiving wireless transmissions and demodulating data contained therein, wherein the data includes at least the program data and locating data; a storage device 635, 640 storing a representation of the venue 100, 100', 100" including locations of the plural sound reproducing transducers of the venue 100, 100', 100" therein; a processor 620 coupled to the receiver 605 and to the storage device 635, 640 for determining from the locating data and from the stored representation of the venue 100, 100', 100" the present location of the personal receiver 500 and distances to respective ones of the sound reproducing transducers of the venue 100, 100', 100"; a programmable delay circuit 615 responsive to the processor 620 for delaying the received program data by a predetermined delay time relating to the determined distances from one or more of the sound reproducing transducers of the venue 100, 100', 100"; a personal sound transducer 520, 520' coupled to the programmable delay circuit 615 for reproducing the delayed received stereo audio data in a human perceivable form; whereby the received stereo audio reproduced by the personal sound transducer 520, 520' is substantially in time alignment with ambient sound from the sound reproducing transducers 210, 212 of the venue 100, 100', 100" in the location of the personal receiver 500. The data received by the receiver 605 may include authorization data, and the processor 620 may process the received authorization data for enabling and disabling reproduction of sound by the personal sound transducer 520, 520'. The reproduction of sound by the personal sound transducer 520, 520' is disabled when the determined location is outside of the boundary 120 of the venue 100, 100', 100" and/or wherein the received authorization data does not correspond with a predetermined condition. The predetermined condition may include the determined location, a unique identifier, an IP address, an electronic serial number, a stored access authorization, a stored ticket access authorization, an admission authorization, a feature authorization, or a combination thereof, stored in the personal receiver. Program data may include video and/or text data, and the personal receiver 500 may further include a display 514, a text display 514, a video display 514, an LCD display 514, or any combination of the foregoing, for reproducing the video and/or text data, and the processor 620 may process the received authorization data for enabling and disabling reproduction of the video and/or text data. A user control 512 may be provided for controlling the stereo audio data reproduced by the personal sound transducer 520, 520' for reproducing the delayed received stereo audio data, and the user control 512 may control reproduction of stereo audio data, reproduction of plural track audio data, reproduction of selected tracks of plural track audio data, reproduction of quadraphonic sound data, reproduction of surround sound data, reproduction of ambient stereo sound, mixing of stereo audio data and ambient stereo sound, reproduction of text data, reproduction of video data, or any combination thereof, if the processor 620 enables such reproduction responsive to the authorization data. Receiver 500 may further comprise a storage device 635, 640, wherein the user control 512 may control recording of stereo audio data, recording of plural track audio data, recording of selected tracks of plural track audio data, recording of quadraphonic sound data, recording of surround sound data, recording of ambient stereo sound, recording of mixed stereo audio data and ambient stereo sound, recording of text data, recording of video data, or any combination thereof, by the storage device 635, 640. The representation of the venue 100, 100', 100" may include locations of the plural sound reproducing transducers 210, 212 of the venue 100, 100', 100" therein and may include: a digital map, a digital plan, a two dimensional CAD drawing, a three dimensional CAD drawing, or a combination there of and the representation of the venue 100, 100', 100" may include locations of the plural sound reproducing transducers 210, 212 of the venue 100, 100', 100" therein may optionally include: a representation of acoustical properties of the venue 100, 100', 100" and/or of the plural sound reproducing transducers 210, 212 therein. The predetermined delay time may be determined by the processor 620 responsive to atmospheric data including temperature, or relative humidity, or barometric pressure, or any combination of temperature, relative humidity and barometric pressure. The personal sound reproducing transducer 520, 520' may include a pair of personal sound transducers 520L, 520L' 520R, 520R' suitable for being respectively located one proximate each of the ears of a user. Personal receiver 500 may further comprise: binaural microphones 530 including a microphone 530L, 530R proximate each of the respective personal sound transducers 520L, 520R for producing respective signals representative of ambient stereo sound thereat; a mixer 650 to which the binaural microphones and the programmable delay circuit 615 may be coupled for receiving and combining the respective signals from the binaural microphones 530 and the delayed received stereo audio data, wherein the combined ambient sound signals and the delayed received stereo audio data from the mixer 650 may be coupled to the personal sound reproducing transducer 520, 520' wherein the ambient stereo sound reproduced thereby is in phase with the ambient stereo sound at the respective ones of the binaural microphones 530. The stereo audio data may include plural track audio data, quadraphonic sound data, surround sound data, or any combination thereof. The present location of the personal receiver 500 determined by the processor 620 may include a distance from the source of the stereo 210, 212 audio data, a distance from the nearest source 210, 212 of stereo audio data, a distance from the nearest source 210, 212, 210L, 210R, 212L, 212R of left and right stereo audio data, or a combination thereof. The representation of the venue 100, 100', 100" may include locations of the plural sound reproducing transducers 210, 212 of the venue 100, 100', 100" and may be a three dimensional representation, wherein at least three different locating data may be received, and the present location of the personal receiver 500 and the distances to respective ones of the sound reproducing transducers 210, 212 of the venue 100, 100', 100" may be determined in three dimensions.

A wireless personal receiver 500 for reproducing program data originating from a source, the personal receiver 500 may comprise: a receiver 605 for receiving wireless transmissions and demodulating data contained therein, wherein the data includes at least the program data and locating data; a processor 620 coupled to the receiver 605 for determining the present location of the personal receiver 500 from the locating data, for determining the actual speed of sound from current local atmospheric data, and for determining from the determined location and the determined speed of sound a delay time representative of the difference in time between the program data received via wireless transmission and program data received as sound via the atmosphere; a programmable delay circuit 615 responsive to the processor 620 for delaying the received program data by the determined delay time; and a device 520, 520' coupled to the programmable delay circuit 615 for reproducing the delayed received program data in a human perceivable form, whereby the reproduced program data and sound received via the atmosphere are in substantial time alignment. The current local atmospheric data may include temperature, or relative humidity, or barometric pressure, or any combination of temperature, relative humidity and barometric pressure. The device 520, 520' for reproducing the delayed received program data may include a pair of sound reproducing devices 520L, 520R suitable for being respectively located one proximate each of the ears of a user, and the personal receiver 500 may further comprise: binaural microphones 530 including a microphone 530L, 530R proximate each of the respective sound reproducing devices 520L, 520R for producing an output representative of ambient sound thereat; a mixer 650 to which the binaural microphones 530 and the programmable delay circuit 615 are coupled for receiving and combining the respective outputs of the binaural microphones 530 and delayed received program data, wherein the combined ambient sound outputs and the delayed received program data from the mixer 650 are coupled to the device 520 for reproducing the delayed received the program data. The device 520 for reproducing the delayed received program data may include a loudspeaker 520, 520', a headphone 520, an ear bud 520, an ear mold 520, a display 514, a text display 514, a video display 514, an LCD display 514, or any combination of the foregoing. The program data may include audio data, stereo audio data, plural track audio data, quadraphonic sound data, surround sound data, text data, video data, or any combination thereof. Personal receiver 500 may further include a user control 512 for controlling the program data reproduced by the device 520, 520' for reproducing the delayed received program data, wherein the user control 512 may control reproduction of audio data, reproduction of stereo audio data, reproduction of plural track audio data, reproduction of selected tracks of plural track audio data, reproduction of quadraphonic sound data, reproduction of surround sound data, reproduction of text data, reproduction of video data, or any combination thereof. Personal receiver 500 may further comprise a storage device 635, 640, wherein the user control 512 may control recording of audio data, recording of stereo audio data, recording of plural track audio data, recording of selected tracks of plural track audio data, recording of quadraphonic sound data, recording of surround sound data, recording of text data, recording of video data, or any combination thereof, by the storage device 635, 640. The present location of the personal receiver 500 determined by the processor 620 may include a distance from the source 210, 212 of the program data, a distance from the nearest source 210, 212 of program data where the program data includes audio data, a distance from the nearest source 210L, 210R, 212L, 212R of left and right program data where the program data includes stereo audio data, or a combination thereof. Personal receiver 500 may be in combination with at least three wireless transmitters 220, 222, 230, wherein each of the three wireless transmitters 220, 222, 230 may transmit the locating data, and at least one of the three wireless transmitters 220, 222, 230 may transmit the program data, and at least one of the three wireless transmitters 220, 222, 230 may optionally transmit the atmospheric data. Personal receiver 500 may be in combination with at least four wireless transmitters 220, 222, 230, wherein each of the four wireless transmitters 220, 222, 230 may transmit the locating data, whereby the personal receiver 500 may be located in three dimensions, and at least one of the four wireless transmitters 220, 222, 230 may transmit the program data, and at least one of the four wireless transmitters 220, 222, 230 may optionally transmit the atmospheric data.

A method for reproducing in a wireless personal receiver 500 program data originating from a source, may comprise: receiving 605 wireless transmissions and demodulating data contained therein, wherein the data includes at least the program data and locating data; determining 620 the present location of the personal receiver 500 from the locating data; receiving 605 current local atmospheric data; determining 620 the actual speed of sound from the current local atmospheric data; determining 620 from the determined location and the determined speed of sound a delay time representative of the difference in time between the program data received via wireless transmission and program data received as sound via the atmosphere; delaying 615 the received program data by the determined delay time; and reproducing 520, 520' the delayed received program data in a human perceivable form, whereby the reproduced program data and sound received via the atmosphere are in substantial time alignment. The current local atmospheric data includes temperature, or relative humidity, or barometric pressure, or any combination of temperature, relative humidity and barometric pressure. Reproducing 520, 520' the delayed received program may data include reproducing the delayed received program data by a pair of sound reproducing devices 520L, 520R suitable for being respectively located one proximate each of the ears of a user, receiving from binaural microphones 530 including a microphone 530L, 530R proximate each of the respective sound reproducing devices 520L, 520R, an output representative of ambient sound thereat; combining 650 the respective outputs of the binaural microphones 530 and the delayed received program data; and reproducing 520, 520' the combined ambient sound outputs and the delayed received the program data. Reproducing 520, 520', 514 the delayed received program data employs a loudspeaker 520, 520', a headphone 520, an ear bud 520, an ear mold 520, a display514, a text display 514, a video display 514, an LCD display 514, or any combination of the foregoing. The program data may include audio data, stereo audio data, plural track audio data, quadraphonic sound data, surround sound data, text data, video data, or any combination thereof. The method may further include controlling 512 reproduction of audio data, reproduction of stereo audio data, reproduction of plural track audio data, reproduction of selected tracks of plural track audio data, reproduction of quadraphonic sound data, reproduction of surround sound data, reproduction of text data, reproduction of video data, or any combination thereof, and may further comprise recording of audio data, recording of stereo audio data, recording of plural track audio data, recording of selected tracks of plural track audio data, recording of quadraphonic sound data, recording of surround sound data, recording of text data, recording of video data, or any combination thereof. Determining the present location of the personal receiver 500 from the locating data may include determining a time difference between received wireless transmissions, determining a phase difference between received wireless transmissions, triangulating between received wireless transmissions, or a combination thereof. The determining 620 the present location of the personal receiver 500 may include determining 620 a distance from the source 210, 212 of the program data, determining 620 a distance from the nearest source 210, 212 of program data where the program data includes audio data, determining 620 a distance from the nearest source 210L, 210R, 212L, 212R of left and right program data where the program data includes stereo audio data, or a combination thereof. The method may further comprise: receiving 605 locating data from at least three wireless transmitters 220, 222, 230; receiving 605 the program data from at least one of the three wireless transmitters 220, 222, 230; and receiving 605 the current local atmospheric data from at least one of the three wireless transmitters 220, 222, 230. The method may further comprise: receiving 605 locating data from at least four wireless transmitters 220, 222, 230; receiving 605 the program data from at least one of the four wireless transmitters 220, 222, 230; and receiving 605 the current local atmospheric data from at least one of the four wireless transmitters 220, 222, 230.

A method for reproducing in a wireless personal receiver 500 stereo program data originating from a source, may comprise: receiving 605 wireless transmissions and demodulating data contained therein, wherein the data includes at least the stereo program data and locating data; determining 620 the present location of the personal receiver 500 from the locating data; receiving 605 current local atmospheric data; determining 620 the actual speed of sound from the current local atmospheric data; determining 620 from the determined location and the determined speed of sound a delay time representative of the difference in time between the stereo program data received 605 via wireless transmission and stereo program data received as sound via the atmosphere; delaying 615 the received stereo program data by the determined delay time; receiving 665 from binaural microphones 530 including a microphone 530L, 530R locatable proximate each of the respective ears of a user signals representative of ambient sound thereat; combining 650 the respective signals of the binaural microphones 530 and the delayed received stereo program data; and reproducing 520, 520' the combined ambient sound signals and the delayed received stereo program data using a pair of sound reproducing transducers 520L, 520R locatable proximate each of the respective ears of a user, whereby the reproduced stereo program data and ambient sound received via the atmosphere and the binaural microphones 530 are reproduced in substantial time alignment. The method may further comprise recording 635, 640 the combined ambient sound signals and the delayed received stereo program data which are in substantial time alignment, and/or recording 635, 640 the received stereo program data. The stereo program data may include stereo audio data, plural track audio data, selected tracks of plural track audio data, quadraphonic sound data, surround sound data, text data, video data, or any combination thereof. Reproducing the combined ambient sound signals and the delayed received stereo program data may employ a loudspeaker 520, 520', a headphone 520, an ear bud 520, an ear mold 520, a display 514, a text display 514, a video display 514, an LCD display 514, or any combination of the foregoing. The program data may include audio data, stereo audio data, plural track audio data, quadraphonic sound data, surround sound data, text data, video data, or any combination thereof. The method may further include controlling 512 reproduction of audio data, reproduction of stereo audio data, reproduction of plural track audio data, reproduction of selected tracks of plural track audio data, reproduction of text data, reproduction of video data, or any combination thereof.

A wireless personal receiver 500 for reproducing stereo program data originating from a source, may comprise: a receiver 605 for receiving wireless transmissions and demodulating data contained therein, wherein the data includes at least the stereo program data and locating data; a processor 620 coupled to the receiver 605 for determining the present location of the personal receiver 500 from the locating data, for determining a delay time representative of the difference in time between the stereo program data received via wireless transmission and stereo program data received as sound via the atmosphere; a programmable delay circuit 615 responsive to the processor 620 for delaying the received stereo program data by the determined delay time; a headphone 520 having left and right sound reproducing devices 520L, 520R for reproducing stereo audio in a human perceivable form; a binaural microphone 630 having left and right microphones 530L, 530R proximate the left and right sound reproducing devices 520L, 520R of the headphones 520 for producing respective signals representative of ambient stereo sound proximate the left and right sound reproducing devices 520L, 520R, respectively; and a mixer 650 coupled to the programmable delay circuit 615 for receiving delayed received stereo program data therefrom and coupled to the binaural microphone 630 for receiving respective signals representative of the ambient stereo sound, wherein the mixer 650 combines the delayed received stereo program data and the respective signals representative of the ambient stereo sound for producing a combined stereo audio signal; and wherein the mixer 650 is coupled to the headphones 520 for providing the combined stereo audio signal thereto, wherein the ambient stereo sound thereon reproduced by the headphones 520 is in phase with the ambient stereo sound at the respective ones of the binaural microphones 530, whereby stereo audio sound containing both the delayed stereo program and the ambient stereo sound is reproduced by the headphones 520. The determined delay time may be determined by the processor 620 responsive to atmospheric data including temperature, or relative humidity, or barometric pressure, or any combination of temperature, relative humidity and barometric pressure. Headphones 520 may include a pair of sound reproducing devices 520L, 520R suitable for being respectively located one proximate each of the ears of a user, and the personal receiver 500 may further comprise: binaural microphones 530 including a microphone 530L, 530R proximate each of the respective sound reproducing devices 520L, 520R for producing respective signals representative of ambient stereo sound thereat; a mixer 650 to which the binaural microphones 530 and the programmable delay circuit 615 are coupled for receiving and combining the respective signals from the binaural microphones 530 and the delayed received stereo program data, wherein the combined ambient sound signals and the delayed received stereo program data from the mixer 650 are coupled to the headphones 520 wherein the ambient stereo sound reproduced by the headphones 520 is in phase with the ambient stereo sound at the respective ones of the binaural microphones 530. Headphones 520 may include a loudspeaker 520, 520', a headphone 520, an ear bud 520, an ear mold 520, or any combination of the foregoing. The stereo program data may include audio data, stereo audio data, plural track audio data, quadraphonic sound data, surround sound data, text data, video data, or any combination thereof. Receiver 500 may further include a user control 512 for controlling the stereo program data reproduced by the headphones 520, wherein the user control 512 may control reproduction of audio data, reproduction of stereo audio data, reproduction of plural track audio data, reproduction of selected tracks of plural track audio data, reproduction of quadraphonic sound data, reproduction of surround sound data, reproduction of ambient stereo sound, mixing of stereo program data and ambient stereo sound, reproduction of text data, reproduction of video data, or any combination thereof. Receiver 500 may further comprise a storage device 635, 640, wherein the user control 512 may control recording of audio data, recording of stereo audio data, recording of plural track audio data, recording of selected tracks of plural track audio data, recording of quadraphonic sound data, recording of surround sound data, recording of ambient stereo sound, recording of mixed stereo program data and ambient stereo sound, recording of text data, recording of video data, or any combination thereof, by the storage device 635, 640. The present location of the personal receiver 500 determined by the processor 620 and may include a distance from the source 210, 212 of the stereo program data, a distance from the nearest source 210, 212, of stereo program data where the stereo program data includes stereo audio data, a distance from the nearest source 210L, 210R, 212L, 212R of left and right program data where the program data includes stereo audio data, or a combination thereof. Personal receiver 500 may be in combination with at least three wireless transmitters 220, 222, 230, wherein each of the three wireless transmitters 220, 222, 230 may transmit the locating data, and wherein at least one of the three wireless transmitters 220, 222, 230 may transmit the stereo program data, and wherein at least one of the three wireless transmitters 220, 222, 230 may optionally transmit atmospheric data. Personal receiver 500 may be in combination with at least four wireless transmitters 220, 222, 230, wherein each of the four wireless transmitters 220, 222, 230 may transmit the locating data, whereby the personal receiver 500 may be located in two dimensions and/or in three dimensions, and wherein at least one of the four wireless transmitters 220, 222, 230 may transmit the stereo program data, and wherein at least one of the four wireless transmitters 220, 222, 230 may optionally transmit atmospheric data.

A wireless personal receiver 500 for reproducing stereo program data originating from a source, wherein stereo program data received via the atmosphere may have normal stereo phasing in certain locations and have reversed stereo phasing in other locations, may comprise: a receiver 605 for receiving wireless transmissions and demodulating data contained therein, wherein the data includes at least the stereo program data and locating data; a processor 620 coupled to the receiver 605 for determining the present location of the personal receiver 500 from the locating data, and for determining from the determined location whether the stereo program data at the determined location has normal stereo phasing or has reversed stereo phasing; a programmable delay circuit 615 responsive to the processor 620 for delaying the received stereo program data by a predetermined delay time; a device 520, 520' coupled to the programmable delay circuit 615 for reproducing the delayed received stereo program data in a human perceivable form; and a spatial correction device 680 coupled to the processor 620 and to at least one of the programmable delay circuit 615 and the reproducing device 520, 520', for reversing the phasing of the delayed received stereo program data reproduced by the reproducing device 520, 520' when the processor 620 determines that the stereo program data at the determined location has reversed stereo phasing, whereby the received stereo program sound produced by the device 520, 520' for reproducing is in phase with ambient sound in the location of the personal receiver 500. The predetermined delay time may be determined by the processor 620 responsive to atmospheric data including temperature, or relative humidity, or barometric pressure, or any combination of temperature, relative humidity and barometric pressure. The device 520, 520' for reproducing the delayed received stereo program data may include a pair of sound reproducing devices 520L, 520R, 520L', 520R' suitable for being respectively located one proximate each of the ears of a user, the personal receiver 500 may further comprise: binaural microphones 530 including a microphone 530L, 530R proximate each of the respective sound reproducing devices 520L, 520R for producing respective signals representative of ambient stereo sound thereat; a mixer 650 to which the binaural microphones 530 and the programmable delay circuit 615 are coupled for receiving and combining the respective signals from the binaural microphones 530 and the delayed received stereo program data, wherein the combined ambient sound signals and the delayed received stereo program data from the mixer 650 are coupled to the device 520, 520' for reproducing the delayed received stereo program data wherein the ambient stereo sound reproduced by the device 520, 520' is in phase with the ambient stereo sound at the respective ones of the binaural microphones 530. The personal receiver 500 may further include a user control 512 for controlling the stereo program data reproduced by the device 520, 520' for reproducing the delayed received stereo program data, wherein the user control 512 may control reproduction of audio data, reproduction of stereo audio data, reproduction of plural track audio data, reproduction of selected tracks of plural track audio data, reproduction of quadraphonic sound data, reproduction of surround sound data, reproduction of ambient stereo sound, mixing of stereo program data and ambient stereo sound, reproduction of text data, reproduction of video data, or any combination thereof. The personal receiver 500 may further comprise a storage device 635, 640, wherein the user control 512 may control recording of audio data, recording of stereo audio data, recording of plural track audio data, recording of selected tracks of plural track audio data, recording of quadraphonic sound data, recording of surround sound data, recording of ambient stereo sound, recording of mixed stereo program data and ambient stereo sound, recording of text data, recording of video data, or any combination thereof, by the storage device 635, 640.

A wireless personal receiver 500 for reproducing left and right channel stereo program data wherein stereo program data received via the atmosphere includes left and right channel stereo sound produced by left and right channel stereo transducers 210L, 210R, 212L, 212R, may comprise: a receiver 605 for receiving wireless transmissions and demodulating data contained therein, wherein the data includes at least the left and right channel stereo program data and locating data; a processor 620 coupled to the receiver 605 for determining the present location of the personal receiver 500from the locating data, and for determining respective distances from the determined location to the respective left and right channel stereo transducers 210L, 210R, 212L, 212R; a programmable delay circuit 615 responsive to the processor 620 for delaying the received left and right channel stereo program data by respective predetermined delay times representative of sound transmission through the atmosphere to the determined location from the respective left and right channel stereo transducers 2210L, 210R, 212L, 212R; a personal sound transducer 520, 520' coupled to the programmable delay circuit 615 for reproducing the delayed received stereo program data in a human perceivable form; and whereby the received stereo program sound produced by the personal sound transducer 520, 520' is substantially in phase with ambient sound from left and right channel stereo transducers 210L, 210R, 212L, 212R in the location of the personal receiver. The respective predetermined delay times may be determined by the processor 620 responsive to atmospheric data including temperature, or relative humidity, or barometric pressure, or any combination of temperature, relative humidity and barometric pressure. The personal sound transducer 520, 520' may include a pair of sound reproducing devices 520L, 520R, 520L', 520R' suitable for being respectively located one proximate each of the ears of a user, the personal receiver 500 may further comprise: binaural microphones 530 including a microphone 530L, 530R proximate each of the respective sound reproducing devices 520L, 520R for producing respective signals representative of ambient left and right channel stereo sound thereat; a mixer 650 to which the binaural microphones 530 and the programmable delay circuit 615 are coupled for receiving and combining the respective signals from the binaural microphones 530 and the delayed received left and right channel stereo program data, wherein the combined ambient left and right channel sound signals and the delayed received left and right channel stereo program data from the mixer 650 are coupled to the personal sound transducer 520, 520' wherein the ambient left and right channel stereo sound reproduced by the personal sound transducer 520, 520' is in phase with the ambient stereo sound at the respective ones of the binaural microphones 530. The personal sound transducer 520, 520' includes a loudspeaker 520, 520', a headphone 520, an ear bud 520, an ear mold 520, a display 514, a text display 514, a video display 514, an LCD display 514, or any combination of the foregoing. The stereo program data may include left and right channel stereo audio data, plural track audio data, quadraphonic sound data, surround sound data, text data, video data, or any combination thereof. The personal receiver 500 may further include a user control 512 for controlling the left and right channel stereo program data reproduced by the personal sound transducer 520, 520', wherein the user control 512 may control reproduction of left and right channel stereo audio data, reproduction of plural track audio data, reproduction of selected tracks of plural track audio data, reproduction of quadraphonic sound data, reproduction of surround sound data, reproduction of ambient left and right channel stereo sound, mixing of left and right channel stereo program data and left and right channel ambient stereo sound, reproduction of text data, reproduction of video data, or any combination thereof. The user control 512 may control recording of left and right channel stereo audio data, recording of plural track audio data, recording of selected tracks of plural track audio data, recording of quadraphonic sound data, recording of surround sound data, recording of ambient left and right channel stereo sound, recording of mixed left and right channel stereo program data and ambient left and right channel stereo sound, recording of text data, recording of video data, or any combination thereof, by the storage device 635, 640.

As used herein, a location is considered to be distant from a sound source, e.g., a live performer or a loudspeaker, if any perceivable time difference were to exist between the sound as received naturally from the source via the atmosphere (natural sound) and the sound as received via transmission to such location by radio, optical or another wireless arrangement, i.e without any time delay in the wireless transmission to compensate for the slower speed of sound propagation through the atmosphere as compared to the higher speed of propagation of radio or optical signals (e.g., at close to the speed of light). Ambient sound at a given location generally includes natural sound at that location plus sound from other sources at a volume sufficient to be perceived at the given location.

As used herein in relation to personal receiver 500, the term "processor" includes controller 620 and all or parts of receiver-demodulator 605, de-multiplexer 610, digital delay circuit 615, local positioning system 625, digital mixer 650, and/or spatial correction circuit 680, that perform a processing function, such as might be performed by a one or more microprocessors. It is understood that a given electronic device, such as a microprocessor, may perform functions described in relation to the foregoing elements of circuit 600, and so the demarcations between functional elements 605-680 in circuit 600 may or may not correspond to actual devices and components in any particular physical embodiment thereof, and/or that plural functions may be shared among plural microprocessors as may be convenient.

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such. It is noted that embodiments of very different sizes, shapes and dimensions may employ the described arrangements.

Atmospheric condition as used herein implies a condition, e.g., temperature, relative humidity, and/or barometric pressure, at a location relatively geographically close to venue 100, 100', 100" at a time relatively close in time to the current time so as to be representative of the actual current atmospheric condition at venue 100, 100', 100". Similarly, audio and sound includes stereo or stereophonic sound and audio, and stereo or stereophonic sound includes at least two channels of audio data, e.g., at least a left channel and a right channel, and also includes plural channel signals such as plural track audio data, quadraphonic audio, 4.1, 5.1, 7.1 and greater surround, pseudo-surround, and quasi-surround sound. In each case, the stereo, quadraphonic and/or surround sound from one or more sound reproduction devices and/or program data may be delayed in time as described herein by the same delay time or may be delayed in time by different amounts of time generally relating to distances from the nearest loudspeakers or other transducers that reproduce such channels of audio/sound.

In the drawing, paths for analog signals and for digital signals having one bit are generally shown as single lines and single line arrows, and paths for digital signals including multiple bits are generally shown as broad arrows, however, single-bit signals, serial information and words may be transmitted over a path shown by either a single line arrow or a broad arrow. A diagonal slash across a single line arrow or a broad arrow accompanied by a number nearby may be used to indicate the number of bits of the digital signals passing along the path indicated thereby.

While the present invention has been described in terms of the foregoing example embodiments, variations within the scope and spirit of the present invention as defined by the claims following will be apparent to those skilled in the art. For example, a receiver 500 may include all of the functions and features described herein or may include only selected ones thereof, and may be utilized in locations and settings other than concert and entertainment venues.

A receiver 500 may be configured to only include the automatic determination of the time delay that is needed to bring the wirelessly broadcast program audio into time alignment with the natural sound, i.e. using a calculated actual speed of sound based upon actual atmospheric conditions.

Similarly, a receiver 500 could be configured to only include the automatic correction of stereo phasing, i.e. when receiver 500 is in an area of reversed stereo phasing of the natural sound.

Further, a receiver 500 could be configured to only include the binaural microphones and automatic volume adjustment so that the user can control the level of natural sound relative to the level of reproduced program audio. As is preferred, the ambient sound from each of binaural microphones 530L, 530R may be separately adjusted in level and reproduced in left and right speakers 520L,520R of headphones 520 so as best to compensate for the attenuation of the left and right headphones 520L, 520R, however, it may be acceptable to adjust both left and right sound levels based upon an average of the sound levels from microphones 530.

While a receiver in certain venues may receive transmitted signals and the data therein from any number of transmitters 220, 222, 230, receiver 500 typically selects the three (or four, as appropriate) signals from the nearest transmitters from which to determine its location, which may be within boundary 120 or may be outside of boundary 120. Optionally, receiver 500 may or may not be programmed, e.g., by authorization data, including location authorization data, for disabling some or all of its functions if it determines its location to be outside of boundary 120.

Wireless transmitters 220, 222, 230 may be arranged so that both channels of stereo program audio are transmitted by the same transmitter, or by selected ones of the transmitters. Alternatively, left and right transmitters 220X, 220Y may be arranged to transmit the left and right program audio channels, respectively. Similarly, atmospheric data, authorization data, text data and/or video data may be transmitted by all or by selected ones of transmitters 220, 222, 230. Preferably, the temperature sensors and other optional atmospheric sensors may be co-located with the transmitter or transmitters 220, 222, 230 that transmit atmospheric data, or may be located centrally and the data communicated to the transmitter or transmitters 220, 222, 230 that transmit such data.

While it is preferred that the determination of the actual local speed of sound be determined by receivers 500 based upon atmospheric data received from transmitters 220, 222, 230, the local speed of sound may be determined from local atmospheric data and then be transmitted by transmitters 220, 222, 230 to receivers 500. Further atmospheric sensors may be included in receivers 500, however, this arrangement is thought to be less accurate because of the wide variation in the possible placement and covering of receiver 500 by a particular user.

Receiver 500 typically and preferably receives indications of the actual local atmospheric conditions in the signal transmitted by one or more of wireless transmitters 220, 222, 230, however, receiver 500 could include a temperature sensor for determining the actual local temperature and receiver 500 could utilize that sensed temperature in determining the actual speed of sound in the venue and the appropriate time delay for synchronizing the broadcast program audio with the natural sound.

While temperature is the atmospheric condition that has the most pronounced effect on the speed of sound, and is in many instances sufficient for determining the local actual speed of sound, other atmospheric conditions such as relative humidity and/or barometric pressure do affect the speed of sound and could be included in the atmospheric data transmitted by transmitters 220, 222, 230, e.g., as might be advantageous for more precise time alignment of program audio and natural sound larger venues.

Similarly to receiver 500 determining its location for selecting broadcast program audio for reproduction via headphones 520, a receiver 500 could be utilized in a commercial setting, such as in a large store, grocery store, supermarket, hypermarket or shopping mall, to select the audio program from a nearby speaker 210 or other source for reproduction in a shopper's or patron's headphones 520 thereby to deliver location specific messages, e.g., sales messages. Further, user inquiries inputted via control 512 may be processed and responded to where receiver 500 is configured for a WiFi or other transmit-capable communication.

In addition, a receiver 500 could be associated and co-located with an auxiliary loudspeaker 212 at which the program audio is to be delayed before being reproduced. Such receiver 500 determines its location in relation to venue 100 and loudspeaker 210, determines the local speed of sound from local atmospheric data (either received via wireless transmission or sensed directly), determines therefrom the delay time to be applied to the program audio, and applies such time delay in delay circuit 615 so that the sound reproduced by auxiliary loudspeaker 212 is time aligned with the natural sound from a loudspeaker 210 in venue 100.

Finally, numerical values stated are typical or example values, are not limiting values, and do not preclude substantially larger and/or substantially smaller values. Values in any given embodiment may be substantially larger and/or may be substantially smaller than the example or typical values stated.

What is claimed is:

1. A personal wireless device for receiving and reproducing when authorized RF broadcast program data including video data, authorization data and audio data of a venue or event, the audio data also reproduced by one or more sound reproducing transducers within the venue or event, said personal wireless device comprising:

a receiver for receiving wireless RF broadcast transmissions and demodulating data contained therein, wherein the data includes at least locating data and authorization data and the program data;

a storage device storing received program data, authorization data and a representation of the venue or event including locations of the sound reproducing transducers within the venue or event, wherein the representation of the venue or event includes a digital map, a digital drawing, a two dimensional CAD drawing and/or a three dimensional CAD drawing and optionally defines locations of one or more spaces, sections, seats, levels, stages, or a combination thereof;

a processor coupled to said receiver for determining from the locating data and from the stored representation of the venue or event the physical location of said personal wireless device and a delay time representative of the difference in time between program data received via wireless transmission and program data received via the atmosphere as sound reproduced by the one or more sound reproducing transducers;

said processor controlling a programmable delay device to delay the received program data by the determined delay time;

a reproducing device including a video display and a sound reproducing transducer coupled to the programmable delay device for reproducing received program data and/or delayed received program video data and audio data in a human perceivable form; and said processor determining from the authorization data an authorization for reproducing the received program data and/or the delayed received program data, wherein said processor enables said reproducing device to reproduce received program video data, audio data and/or text data in accordance with the authorization if said personal wireless receiver is within an authorized physical location, space, section, seat and/or time of the venue or event, whereby the reproduced program data and the ambient sound received from the sound reproducing transducers via the atmosphere at the location of said personal wireless device are in substantial time alignment if reproduction thereof is authorized.

2. The personal wireless device of claim 1 wherein said processor disables said reproducing device from reproducing received program video data and audio data in accordance with the authorization if said personal wireless receiver is not within an authorized physical space, section, seat and/or time of the venue or event.

3. The personal wireless device of claim 1 wherein the predetermined condition includes: a location, or a location, space, section and/or seat within the venue, or an Internet Protocol (IP) address, or an electronic serial number (ESN), or unique identifying data associated with said personal wireless device, or a stored access authorization, or a stored ticket access authorization, or an admission authorization, or an in attendance ticket authorization, or a combination thereof.

4. The personal wireless device of claim 1 wherein the authorization data, the locating data, or both, is received via an AM signal, an FM signal, a phase modulated signal, CDMA, TDMA, spread spectrum, the Internet, a WiFi connection, a Bluetooth connection, a network, a wireless network, a USB connection, or a combination thereof.

5. The personal wireless device of claim 1 further including a transmitter, wherein:

the authorization includes one or more authorizations obtained using the transmitter and receiver of said personal wireless device via programming, scanning of the personal wireless device, the Internet, a WiFi connection, a network, a wireless network, a USB connection, or a combination thereof; or the authorization is purchased using the transmitter and receiver of said personal wireless device via programming, scanning of said personal wireless device, the Internet, a WiFi connection, a network, a wireless network, a USB connection, or a combination thereof; or the authorization is purchased and obtained using the transmitter and receiver of said personal wireless device via programming, scanning of the personal wireless device, the Internet, a WiFi connection, a network, a wireless network, a USB connection, or a combination thereof.

6. The personal wireless device of claim 5 wherein the authorization purchased by programming, scanning, the Internet, a WiFi connection, a network, a wireless network, and/or a USB connection, defines a ticket number that is broadcast at the venue or event as an approved ticket number of the authorization data.

7. The personal wireless device of claim 1 wherein an in attendance ticket number relating to an event is stored in said storage device, the in attendance ticket number representing a ticket to the event, an admission ticket to the event, a location at the event, a seat number of the event, and/or an access to receive, reproduce, mix, record, re-mix, re-record, playback and/or export the received program data, the delayed received program data, or both.

8. The personal wireless device of claim 7 wherein said personal wireless device is scanned to obtain admission authorizations stored in the storage device therein for gaining admission to the venue or event, and wherein authorizations to receive, reproduce, mix and/or record program data are not enabled unless the determined physical location of said personal wireless device corresponds to a physical location, space, section, seat and/or time of said venue or event that is authorized by the authorization data therefor.

9. The personal wireless device of claim 1 wherein said processor determines access rights authorized by the authorization data and enables and disables circuitry of said personal wireless device and/or functions thereof in accordance with the authorization data.

10. The personal wireless device of claim 1 wherein said processor determines the location of said personal wireless device: by comparing the timing of the received locating signals, by comparing the phase of the received locating signals, by comparing the relative arrival times of the received locating signals, by triangulation, by a local positioning (LPS) device, by a global positioning system (GPS), or by a combination thereof.

11. The personal wireless device of claim 1 wherein said personal wireless device responds to the determined location of the venue or event to determine whether it is in an authorized location, section and/or seat of the venue or event at an authorized time of the venue or event and if so authorized, then to enable admission to the venue or event and enable reception, reproduction, recording, mixing, modification, re-mixing, re-recording, playback and/or exporting of the received RF broadcast program data and/or the delayed program data of the venue or event in accordance with the authorization and ticketing, but if not authorized, then to deny admission to the venue and disable reception, reproduction, recording, mixing, modification, re-mixing, re-recording, playback and/or exporting of the received program data and/or the delayed program data in accordance with the authorization and ticketing for the venue or event.

12. The personal wireless device of claim 1 wherein the personal wireless device includes a personal electronic device, a personal digital assistant (PDA), a mobile phone, a Blackberry device, an MP3 player, an iPod device, an iPhone device, or a satellite radio receiver.

13. The personal wireless device of claim 1 wherein the stored representation of the venue includes: a representation of acoustical properties of the venue and/or of the sound reproducing transducers therein.

14. The personal wireless device of claim 1 wherein a concert and/or event proprietor or operator may charge separate and distinct fees for different levels of access, including for personal wireless device to be enabled to receive the audio program to listen only or to listen and adjust, to receive the audio program to listen only to L+R stereo audio or to listen and adjust L+R stereo audio, to receive a multi-track stereo audio program to listen only or to listen and adjust only, to receive the video program to view only, to receive the audio and video programs to listen and view, to record the stereo audio program, to record the multi-track audio program, and/or to record the video program, and wherein the foregoing levels of access may be purchased prior to or during the concert or event to which the levels of access pertain.

15. The personal wireless device of claim 1 wherein said reproducing device includes a pair of personal sound reproducing transducers suitable for being respectively located one proximate each ear of a user, said personal wireless device further comprising:

binaural microphones including a microphone proximate each of the respective personal sound reproducing transducers for producing respective signals representative of ambient stereo sound thereat;

a mixer to which said binaural microphones and said programmable delay device are coupled for receiving and combining the respective signals from said binaural microphones and the delayed received stereo audio data, wherein the combined ambient sound signals and the delayed received stereo audio data from said mixer are coupled to said personal sound reproducing transducers wherein the ambient stereo sound reproduced thereby is in phase with the ambient stereo sound at the respective ones of said binaural microphones.

16. A method for operating a personal wireless device for receiving and reproducing when authorized RF broadcast program data including video data, authorization data and audio data of a venue or event, the audio data also reproduced by one or more sound reproducing transducers within the venue or event, said method for operating a personal wireless device comprising:

receiving wireless RF broadcast transmissions and demodulating data contained therein, wherein the data includes at least locating data and authorization data and the program data;

storing received program data, authorization data and a representation of the venue or event including locations of the sound reproducing transducers within the venue or event, wherein the representation of the venue or event includes a digital map, a digital drawing, a two dimensional CAD drawing, and/or a three dimensional CAD drawing and optionally defines locations of one or more spaces, sections, seats, levels, stages, or a combination thereof;

determining from the locating data and from the stored representation of the venue or event the physical location of the personal wireless device and a delay time representative of the difference in time between program data received via wireless transmission and program data received via the atmosphere as sound reproduced by the one or more sound reproducing transducers;

controlling a programmable delay device to delay the received program data by the determined delay time;

reproducing via a video display and a sound reproducing transducer received program data and/or delayed received program video data and audio data in a human perceivable form; and determining from the authorization data an authorization for reproducing the received program data and/or the delayed received program data, wherein received program video data, audio data and/or text data is reproduced in accordance with the authorization if the personal wireless receiver is within an authorized physical location, space, section, seat and/or time of the venue or event, whereby the reproduced program data and the ambient sound received from the sound reproducing transducers via the atmosphere at the location of said personal wireless device are in substantial time alignment if reproduction thereof is authorized.

17. The method for operating a personal wireless device of claim 16 further comprising disabling the reproducing of received program video data and audio data in accordance with the authorization if the personal wireless receiver is not within an authorized physical space, section, seat and/or time of the venue or event.

18. The method for operating a personal wireless device of claim 16 wherein the predetermined condition includes: a location, or a location within the venue, or a map including a location, or an Internet Protocol (IP) address, or an electronic serial number (ESN), or unique identifying data associated with said personal wireless device, or a stored access authorization, or a stored ticket access authorization, or an admission authorization, or an in attendance ticket authorization, or a combination thereof.

19. The method for operating a personal wireless device of claim 16 wherein the authorization data, the locating data, or both, is received via an AM signal, an FM signal, a phase modulated signal, CDMA, TDMA, spread spectrum, the Internet, a WiFi connection, a Bluetooth connection, a network, a wireless network, a USB connection, or a combination thereof.

20. The method for operating a personal wireless device of claim 16 further including transmitting data from the personal wireless device, wherein:

the authorization includes one or more authorizations obtained via programming, scanning of the personal wireless device, the Internet, a WiFi connection, a network, a wireless network, a USB connection, or a combination thereof; or the authorization is purchased via programming, scanning of the personal wireless device, the Internet, a WiFi connection, a network, a wireless network, a USB connection, or a combination thereof; or the authorization is purchased and obtained via programming, scanning of the personal wireless device, the Internet, a WiFi connection, a network, a wireless network, a USB connection, or a combination thereof.

21. The method for operating a personal wireless device of claim 20 wherein the authorization purchased by programming, scanning, the Internet, a WiFi connection, a network, a wireless network, and/or a USB connection, defines a ticket number that is broadcast at the venue or event as an approved ticket number of the authorization data.

22. The method for operating a personal wireless device of claim 16 further comprising storing an in attendance ticket number relating to an event in the personal wireless device, the in attendance ticket number representing a ticket to the event, an admission ticket to the event, a location at the event, a seat number of the event, and/or an access to receive, reproduce, mix, record, re-mix, re-record, playback and/or export the received program data, the delayed received program data, or both.

23. The method for operating a personal wireless device of claim 22 wherein the personal wireless device is scanned to obtain admission authorizations stored therein for gaining admission to the venue or event, and wherein authorizations to receive, reproduce, mix and/or record program data are not enabled unless the determined physical location of said personal wireless device corresponds to a physical location, space, section, seat and/or time of said venue or event that is authorized by the authorization data therefor.

24. The method for operating a personal wireless device of claim 16 further comprising determining access rights authorized by the authorization data and enabling and disabling circuitry of the personal wireless device and/or functions thereof in accordance with the authorization data.

25. The method for operating a personal wireless device of claim 16 further comprising determining the location of the personal wireless device: by comparing the timing of the received locating signals, by comparing the phase of the received locating signals, by comparing the relative arrival times of the received locating signals, by triangulation, by a local positioning (LPS) device, by a global positioning system (GPS), or by a combination thereof.

26. The method for operating a personal wireless device of claim 16 further comprising determining whether the determined physical location of the personal wireless device in the venue or event is an authorized location, section and/or seat of the venue or event at an authorized time of the venue or event and if so authorized, then enabling admission to the venue or event and enabling reception, reproduction, recording, mixing, modification, re-mixing, re-recording, playback and/or exporting of the received RF broadcast program data and/or the delayed program data of the venue or event in accordance with the authorization and ticketing, but if not authorized, then to deny admission to the venue and disable reception, reproduction, recording, mixing, modification, re-mixing, re-recording, playback and/or exporting of the received program data and/or the delayed program data in accordance with the authorization and ticketing for the venue or event.

27. The method for operating a personal wireless device of claim 16 wherein the personal wireless device includes a personal electronic device, a personal digital assistant (PDA), a mobile phone, a Blackberry device, an MP3 player, an iPod device, an iPhone device, or a satellite radio receiver.

28. The method for operating a personal wireless device of claim 16 wherein the stored representation of the venue includes: a representation of acoustical properties of the venue and/or of the sound reproducing transducers therein.

29. The method for operating a personal wireless device of claim 16 wherein a concert and/or event proprietor or operator may charge separate and distinct fees for different levels of access, including for personal wireless device to be enabled to receive the audio program to listen only or to listen and adjust, to receive the audio program to listen only to L+R stereo audio or to listen and adjust L+R stereo audio, to receive a multi-track stereo audio program to listen only or to listen and adjust only, to receive the video program to view only, to receive the audio and video programs to listen and view, to record the stereo audio program, to record the multi-track audio program, and/or to record the video program, and wherein the foregoing levels of access may be purchased prior to or during the concert or event to which the levels of access pertain.

30. The method for operating a personal wireless device of claim 29 further comprising:

producing a signal representative of ambient sound at a microphone associated with the personal wireless device;

mixing the signal representative of ambient sound and delayed received program data; and storing any or all of the ambient sound signal, the delayed received program data, and the mixed ambient sound signal and delayed received program data.

31. The method for operating a personal wireless device of claim 30 wherein the stored ambient sound signal, the stored delayed received program data, and the stored mixed ambient sound signal and delayed received program data, may be reproduced, played back, re-mixed, re-recorded and/or exported.

32. The method for operating a personal wireless device of claim 29 further comprising:

producing a signal representative of ambient sound at a microphone associated with the personal wireless device;

mixing the signal representative of ambient sound and delayed received program data; and reproducing any or all of the ambient sound signal, the delayed received program data, and the mixed ambient sound signal and delayed received program data.

33. The method for operating a personal wireless device of claim 16 wherein said reproducing the delayed received program data includes reproducing the delayed received program data via a pair of personal sound reproducing transducers suitable for being respectively located one proximate each ear of a user, said method for operating a personal wireless device further comprising:

producing respective signals representative of ambient stereo sound at binaural microphones including a microphone proximate each of the respective personal sound reproducing transducers;

mixing the respective signals from the binaural microphones and delayed received stereo audio data; and coupling the mixed combined ambient sound signals and the delayed received stereo audio data to the personal sound reproducing transducers wherein the ambient stereo sound reproduced thereby is in phase with the ambient stereo sound at the respective ones of the binaural microphones.

34. The method for operating a personal wireless device of claim 16 wherein a concert and/or event proprietor or operator or broadcaster may charge separate and distinct fees for different levels of access, including for the personal wireless device to be enabled: to receive audio data, to receive video data, to reproduce audio data, to reproduce video data, to record audio data, to record video data, to recall recorded audio data, to recall recorded video data, to reproduce recorded audio data for re-mixing, to reproduce recorded video data for re-mixing, to reproduce recorded tracks for re-mixing, to playback any of the foregoing, to re-record any of the foregoing at a later time, to grant rights, to authorize a package, or a combination thereof.

35. The method for operating a personal wireless device of claim 34 wherein a concert and/or event proprietor or operator or broadcaster may charge separate and distinct fees for the personal wireless device to be enabled: to download any of the recalled, reproduced, and/or re-mixed data set forth in claim 81 via the Internet, a WiFi connection, a network, a wireless network, a USB connection, or via a combination thereof.

36. A personal wireless device for reproducing when authorized program data including audio data reproduced by one or more sound reproducing transducers within a venue, said personal wireless device comprising:

a receiver for receiving wireless transmissions and demodulating data contained therein, wherein the data includes at authorization data and the program data;

a storage device for storing data therein:

a processor coupled to said receiver for determining a delay time representative of the difference in time between program data received via wireless transmission and program data received via the atmosphere as sound reproduced by the one or more sound reproducing transducers;

said processor controlling a programmable delay device to delay the received program data by the determined delay time;

a reproducing device coupled to the programmable delay device for reproducing the delayed received program data in a human perceivable form; and said processor determining from the authorization data an authorization for reproducing the received program data and/or the delayed received program data;

wherein said processor enables said reproducing device to reproduce received program data in accordance with the authorization, whereby the reproduced program data and the ambient sound received from the sound reproducing transducers via the atmosphere at the location of said personal wireless device are in substantial time alignment if reproduction thereof is authorized.

37. The personal wireless device of claim 36 wherein said processor disables reproduction of the program data if said personal wireless device is not at a location within the venue, or if the location of said personal wireless device is not within a predetermined boundary, or if the time is not within a predetermined time period, or if the authorization does not correspond with a predetermined condition, or if a ticket number is not a predetermined ticket number, or a combination thereof.

38. The personal wireless device of claim 36 wherein the authorization data defines the predetermined condition to include: a location, or a location, space, section and/or seat within the venue, or a map including a location, or an Internet Protocol (IP) address, or an electronic serial number (ESN), or unique identifying data associated with said personal wireless device, or a stored access authorization, or a stored ticket access authorization, or an admission authorization, or an in attendance ticket authorization, or a combination thereof.

39. The personal wireless device of claim 36 wherein the predetermined condition includes: a location, or a location, space, section and/or seat within the venue, or an Internet Protocol (IP) address, or an electronic serial number (ESN), or unique identifying data associated with said personal wireless device, or a stored access authorization, or a stored ticket access authorization, or an admission authorization, or an in attendance ticket authorization, or a combination thereof.

40. The personal wireless device of claim 36 wherein the authorization:

enables admission to a venue, admission to particular portion of a venue, admission to a particular region of a venue, admission to a space, admission to a seating area, admission to a premium seating area, and/or admission to a seat;

enables receiving of program data including audio programming, video programming, stereo audio programming, plural track audio programming, and/or text data;

enables reproduction of program data based upon a type of program data, a boundary, a map, a venue boundary, a venue map, receiver location, time, ticketing, rights granted, rights purchased, and/or a package purchased;

enables recording of program data, a type of program data, mixing of program data with other data, recording of delayed program data, audio programming, video programming, stereo audio programming, and/or plural track audio programming;

enables reproduction of recorded program data, a type of program data, mixing of program data with other data, recording of delayed program data, audio programming, video programming, stereo audio programming, and/or plural track audio programming;

or any combination thereof.

41. The personal wireless device of claim 36 wherein the authorization data is received via an AM signal, an FM signal, a phase modulated signal, CDMA, TDMA, spread spectrum, the Internet, a WiFi connection, a Bluetooth connection, a network, a wireless network, a USB connection, or a combination thereof.

42. The personal wireless device of claim 36 further including a transmitter, wherein:

the authorization is obtained using the transmitter and receiver of said personal wireless device via the Internet, a WiFi connection, a network, a wireless network, a USB connection, or a combination thereof; or the authorization is purchased using the transmitter and receiver of said personal wireless device via the Internet, a WiFi connection, a network, a wireless network, a USB connection, or a combination thereof; or the authorization is purchased and obtained using the transmitter and receiver of said personal wireless device via the Internet, a WiFi connection, a network, a wireless network, a USB connection, or a combination thereof.

43. The personal wireless device of claim 42 wherein the authorization is stored in said storage device.

44. The personal wireless device of claim 36 wherein an in attendance ticket number relating to an event is stored in said storage device, the in attendance ticket number representing a ticket to the event, an admission ticket to the event, a location at the event, a seat number of the event, and/or an access to reproduce, mix, record, re-mix, re-record, playback and/or export the received program data, the delayed received program data, or both.

45. The personal wireless device of claim 44 wherein said processor processes the authorization data and the in attendance ticket number to enable and disable circuitry of said personal wireless device and/or functions thereof in accordance with the authorization data and the in attendance ticket number.

46. The personal wireless device of claim 36 wherein said processor determines access rights authorized by the authorization data and enables and disables circuitry of said personal wireless device and/or functions thereof in accordance with the authorization data.

47. The personal wireless device of claim 36 wherein said processor determines the location of said personal wireless device: by comparing the timing of received locating signals, by comparing the phase of received locating signals, by comparing the relative arrival times of received locating signals, by triangulation, by a local positioning (LPS) device, by a global positioning system (GPS), or by a combination thereof.

48. The personal wireless device of claim 47 wherein the received locating signals are received via an AM signal, an FM signal, a phase modulated signal, CDMA, TDMA, spread spectrum, the Internet, a WiFi connection, a Bluetooth connection, a network, a wireless network, a USB connection, or a combination thereof.

49. The personal wireless device of claim 47 wherein said personal wireless device responds to the determined location of the venue to determine whether it is in an authorized location at an authorized time and if so, to enable admission to the venue, reception, reproduction, recording, mixing, modification, re-mixing, re-recording, playback and/or exporting of the received program data and/or the delayed program data in accordance with the authorization and ticketing, but if not, then to deny admission to the venue and disable reception, reproduction, recording, mixing, modification, re-mixing, re-recording, playback and/or exporting of the received program data and/or the delayed program data in accordance with the authorization and ticketing.

50. The personal wireless device of claim 36 wherein the personal wireless device includes a personal electronic device, a personal digital assistant (PDA), a mobile phone, a Blackberry device, an MP3 player, an iPod device, an iPhone device, or a satellite radio receiver.

51. The personal wireless device of claim 36 wherein a representation of the venue is stored in said storage device, and wherein the stored representation of the venue includes:

a digital map, a digital plan, a two dimensional CAD drawing, a three dimensional CAD drawing, or a combination thereof; and wherein the stored representation of the venue optionally includes:

a representation of acoustical properties of the venue and/or of the sound reproducing transducers therein.

52. The personal wireless device of claim 36 wherein said reproducing device includes a pair of personal sound reproducing transducers suitable for being respectively located one proximate each ear of a user, said personal wireless device further comprising:

binaural microphones including a microphone proximate each of the respective personal sound reproducing transducers for producing respective signals representative of ambient stereo sound thereat;

a mixer to which said binaural microphones and said programmable delay device are coupled for receiving and combining the respective signals from said binaural microphones and the delayed received stereo audio data, wherein the combined ambient sound signals and the delayed received stereo audio data from said mixer are coupled to said personal sound reproducing transducers wherein the ambient stereo sound reproduced thereby is in phase with the ambient stereo sound at the respective ones of said binaural microphones.

53. The personal wireless device of claim 36 wherein the data received by said receiver includes locating data, and wherein said storage device stores a representation of the venue, wherein said processor determines from the locating data and from the stored representation of the venue the location of said personal wireless device.

54. The personal wireless device of claim 36 wherein a representation of at least the authorization data is stored in said storage device.

55. The personal wireless device of claim 36 wherein the authorization data is stored in said storage device, and said reproducing device includes a display and wherein a representation of the stored authorization data is displayed thereon.

56. The personal wireless device of claim 55 wherein:

the displayed representation of the stored authorization data is scanned to identify ticket data therein; or the displayed representation of the stored authorization data is scanned to identify ticket data therein and the identified ticket data is matched to a ticket.

57. The personal wireless device of claim 55 wherein the ticket data includes a ticket number.

58. The personal wireless device of claim 36 wherein the operation of said personal wireless device for processing and reproducing program data is controlled by the operator of the venue, performance, transmitters, of a combination thereof.

59. The personal wireless device of claim 36 wherein the authorization:

enables receiving of audio program data, stereo audio program data, plural track audio program data, video program data, text data, a type of program data, or any combination thereof; or enables mixing of audio program data, stereo audio program data, plural track audio program data, video program data, text data, a type of program data, or any combination thereof, with other program data; or enables reproduction of delayed audio program data, stereo audio program data, plural track audio program data, video program data, text data, a type of program data, or any combination thereof; or enables mixing of delayed audio program data, stereo audio program data, plural track audio program data, video program data, text data, a type of program data, or any combination thereof, with other program data; or enables recording of audio program data, stereo audio program data, plural track audio program data, video program data, text data, a type of program data, or any combination thereof; or enables mixing of the recorded audio program data, stereo audio program data, plural track audio program data, video program data, text data, a type of program data, or any combination thereof; or enables recording of delayed audio program data, stereo audio program data, plural track audio program data, video program data, text data, a type of program data, or any combination thereof; or enables mixing of recorded delayed audio program data, stereo audio program data, plural track audio program data, video program data, text data, a type of program data, or any combination thereof; or enables re recording of audio program data, stereo audio program data, plural track audio program data, video program data, text data, a type of program data, or any combination thereof; or enables re mixing of the recorded audio program data, stereo audio program data, plural track audio program data, video program data, text data, a type of program data, or any combination thereof; or enables re recording of delayed audio program data, stereo audio program data, plural track audio program data, video program data, text data, a type of program data, or any combination thereof; or enables re mixing of recorded delayed audio program data, stereo audio program data, plural track audio program data, video program data, text data, a type of program data, or any combination thereof; or enables exporting of audio program data, stereo audio program data, plural track audio program data, video program data, text data, or a type of program data, that is received, reproduced, recorded, mixed, re mixed, and/or re recorded, or any combination thereof; or enables said personal wireless device to serve as a Karaoke device using any or a combination of the foregoing.

60. A method for operating a personal wireless device for reproducing when authorized program data including audio data reproduced by one or more sound reproducing transducers within a venue, said method for operating a personal wireless device comprising:

receiving wireless transmissions and demodulating data contained therein, wherein the data includes at least authorization data and the program data;

determining a delay time representative of the difference in time between program data received via wireless transmission and program data received via the atmosphere as sound reproduced by the one or more sound reproducing transducers;

controlling a programmable delay device to delay the received program data by the determined delay time;

reproducing the delayed received program data in a human perceivable form;

determining from the authorization data an authorization for reproducing the received program data and/or the delayed received program data; and enabling a reproducing device to reproduce received program data in accordance with the authorization, whereby the reproduced program data and the ambient sound received from the sound reproducing transducers via the atmosphere at the location of said personal wireless device are in substantial time alignment if reproduction thereof is authorized.

61. The method for operating a personal wireless device of claim 60 further comprising disabling reproduction of the program data if the personal wireless device is not at a location within the venue, or if the location of said personal wireless device is not within a predetermined boundary, or if the time is not within a predetermined time period, or if the authorization does not correspond with a predetermined condition, or if a ticket number is not a predetermined ticket number, or a combination thereof.

62. The method for operating a personal wireless device of claim 60 wherein the authorization data defines the predetermined condition to include: a location, or a location within the venue, or a map including a location, or an Internet Protocol (IP) address, or an electronic serial number (ESN), or unique identifying data associated with said personal wireless device, or a stored access authorization, or a stored ticket access authorization, or an admission authorization, or a combination thereof.

63. The method for operating a personal wireless device of claim 60 wherein the predetermined condition includes: a location, or a location within the venue, or an Internet Protocol (IP) address, or an electronic serial number (ESN), or unique identifying data associated with said personal wireless device, or a stored access authorization, or a stored ticket access authorization, or an admission authorization, or an in attendance ticket authorization, or a combination thereof.

64. The method for operating a personal wireless device of claim 60 wherein the authorization:

enables admission to a venue, admission to particular portion of a venue, admission to a particular region of a venue, admission to a space, admission to a seating area, admission to a premium seating area, and/or admission to a seat;

enables receiving of program data including audio programming, video programming, stereo audio programming, plural track audio programming, and/or text data;

enables reproduction of program data based upon a type of program data, a boundary, a map, a venue boundary, a venue map, receiver location, time, ticketing, rights granted, rights purchased, and/or a package purchased;

enables recording of program data, a type of program data, mixing of program data with other data, recording of delayed program data, audio programming, video programming, stereo audio programming, and/or plural track audio programming;

enables reproduction of recorded program data, a type of program data, mixing of program data with other data, recording of delayed program data, audio programming, video programming, stereo audio programming, and/or plural track audio programming;

or any combination thereof.

65. The method for operating a personal wireless device of claim 60 wherein the authorization data is received via an AM signal, an FM signal, a phase modulated signal, CDMA, TDMA, spread spectrum, the Internet, a WiFi connection, a Bluetooth connection, a network, a wireless network, a USB connection, or a combination thereof.

66. The method for operating a personal wireless device of claim 60 wherein:

the authorization is obtained using a transmitter and a receiver of the personal wireless device via the Internet, a WiFi connection, a network, a wireless network, a USB connection, or a combination thereof; or the authorization is purchased using the transmitter and receiver of the personal wireless device via the Internet, a WiFi connection, a network, a wireless network, a USB connection, or a combination thereof; or the authorization is purchased and obtained using the transmitter and receiver of the personal wireless device via the Internet, a WiFi connection, a network, a wireless network, a USB connection, or a combination thereof.

67. The method for operating a personal wireless device of claim 66 wherein the authorization is stored in a storage device.

68. The method for operating a personal wireless device of claim 60 wherein an in attendance ticket number relating to an event is stored in a storage device, the in attendance ticket number representing a ticket to the event, an admission ticket to the event, a location at the event, a seat number of the event, and/or an access to reproduce, mix, record, re-mix, re-record, playback and/or export the received program data, the delayed received program data, or both.

69. The method for operating a personal wireless device of claim 68 further comprising processing the authorization data and the in attendance ticket number to enable and disable circuitry of said personal wireless device and/or functions thereof in accordance with the authorization data and the in attendance ticket number.

70. The method for operating a personal wireless device of claim 60 further comprising determining access rights authorized by the authorization data and enabling and disabling circuitry of the personal wireless device and/or functions thereof in accordance with the authorization data.

71. The method for operating a personal wireless device of claim 60 further comprising determining the location of the personal wireless device: by comparing the timing of received locating signals, by comparing the phase of received locating signals, by comparing the relative arrival times of received locating signals, by triangulation, by a local positioning (LPS) device, by a global positioning system (GPS), or by a combination thereof.

72. The method for operating a personal wireless device of claim 71 wherein the received locating signals are received via an AM signal, an FM signal, a phase modulated signal, CDMA, TDMA, spread spectrum, the Internet, a WiFi connection, a Bluetooth connection, a network, a wireless network, a USB connection, or a combination thereof.

73. The method for operating a personal wireless device of claim 71 further comprising responding to the determined location to determine whether it is in an authorized location at an authorized time and if so, enabling admission to the venue, reception, reproduction, recording, mixing, modification, re-mixing, re-recording, playback and/or exporting of the received program data and/or the delayed program data in accordance with the authorization and ticketing, but if not, then denying admission to the venue and disabling reception, reproduction, recording, mixing, modification, re-mixing, re-recording, playback and/or exporting of the received program data and/or the delayed program data in accordance with the authorization and ticketing.

74. The method for operating a personal wireless device of claim 60 wherein the personal wireless device includes a personal electronic device, a personal digital assistant (PDA), a mobile phone, a Blackberry device, an MP3 player, an iPod device, an iPhone device, or a satellite radio receiver.

75. The method for operating a personal wireless device of claim 60 further comprising storing a representation of the venue, wherein the stored representation of the venue includes:

a digital map, a digital plan, a two dimensional CAD drawing, a three dimensional CAD drawing, or a combination thereof; and wherein the stored representation of the venue optionally includes:

a representation of acoustical properties of the venue and/or of the sound reproducing transducers therein.

76. The method for operating a personal wireless device of claim 60 wherein said reproducing the delayed received program data includes reproducing the delayed received program data via a pair of personal sound reproducing transducers suitable for being respectively located one proximate each ear of a user, said method for operating a personal wireless device further comprising:

producing respective signals representative of ambient stereo sound at binaural microphones including a microphone proximate each of the respective personal sound reproducing transducers;

mixing the respective signals from the binaural microphones and delayed received stereo audio data; and coupling the mixed combined ambient sound signals and the delayed received stereo audio data to the personal sound reproducing transducers wherein the ambient stereo sound reproduced thereby is in phase with the ambient stereo sound at the respective ones of the binaural microphones.

77. The method for operating a personal wireless device of claim 60 wherein the data received includes locating data, said method further comprising:

storing a representation of the venue; and determining the location of the personal wireless device from the received locating data and the stored representation of the venue.

78. The method for operating a personal wireless device of claim 60 further comprising storing a representation of at least the authorization data.

79. The method for operating a personal wireless device of claim 60 further comprising displaying a representation of the authorization data on the personal wireless receiver.

80. The method for operating a personal wireless device of claim 79 further comprising:

scanning the displayed representation of the authorization data to identify ticket data therein; or scanning the displayed representation of the authorization data to identify ticket data therein and matching the identified ticket data with a ticket.

81. The method for operating a personal wireless device of claim 80 wherein the ticket data includes a ticket number.

82. The method for operating a personal wireless device of claim 60 further comprising:

obtaining a ticket to the venue or to a concert or an event; or scanning the ticket to the venue or to a concert or an event to obtain ticket data thereof; or obtaining a ticket to the venue or to a concert or event, and scanning the ticket to obtain ticket data thereof.

83. The method for operating a personal wireless device of claim 82 wherein the ticket data includes a ticket number.

84. The method for operating a personal wireless device of claim 82 wherein the ticket is purchased prior to a concert or event, during a concert or event, or prior to and during a concert or event.

85. The method for operating a personal wireless device of claim 60 wherein a ticket is purchased prior to a concert or event, during a concert or event, or prior to and during a concert or event.

86. The method for operating a personal wireless device of claim 60 wherein the purchased ticket represents a payment required for entry to or attendance at the concert or event, or to operate the personal wireless receiver at the concert or event, or both.

87. The method for operating a personal wireless device of claim 60 further comprising:

receiving ticket data of a purchased ticket that has been scanned;

matching the ticket data of the scanned ticket and the authorization data; and if the ticket data of the scanned ticket and the authorization data match, then:

storing the matched scanned ticket data and authorization data; or communicating the matched scanned ticket data to a broadcast computer; or storing the matched scanned ticket data and communicating the matched scanned ticket data to a broadcast computer.

88. The method for operating a personal wireless device of claim 87 wherein the ticket data includes a ticket number.

89. The method for operating a personal wireless device of claim 87 further comprising:

storing the received ticket data of the scanned purchased ticket in the personal wireless device.

90. The method for operating a personal wireless device of claim 89 wherein the ticket data includes a ticket number.

91. The method for operating a personal wireless device of claim 87 wherein an in-attendance ticket number is stored in the personal wireless device, said method further comprising:

receiving authorization data including an approved and in-attendance ticket number;

comparing the stored in-attendance ticket number and the received approved and in-attendance ticket number, and if there is correspondence between the stored in-attendance ticket number and the received approved and in-attendance ticket number, then:

enabling the personal wireless device for processing the received program data in accordance with the received authorization data including for reproducing the received program data.

92. The method for operating a personal wireless device of claim 91 further comprising:

if there is not correspondence between the stored in-attendance ticket number and the received approved and in-attendance ticket number, then:

disabling the personal wireless device from processing the received program data including from reproducing the received program data.

93. The method for operating a personal wireless device of claim 60 further comprising storing the authorization data wherein the authorization data includes ticket data, said method further comprising:

receiving transmitted valid ticket data;

comparing the received valid ticket data and the stored ticket data; and if the received valid ticket data and the stored ticket data match, then:

enabling the personal wireless device to process received program data in accordance with the valid ticket data, or the stored ticket data, or the stored authorization data, or with a combination thereof.

94. The method for operating a personal wireless device of claim 60 wherein the authorization data enables the personal wireless receiver to record an event, or to record a particular song, or to record a program, or a combination thereof.

95. The method for operating a personal wireless device of claim 60 further comprising:

producing a signal representative of ambient sound at a microphone associated with the personal wireless device;

mixing the signal representative of ambient sound and delayed received program data; and storing any or all of the ambient sound signal, the delayed received program data, and the mixed ambient sound signal and delayed received program data.

96. The method for operating a personal wireless device of claim 60 further comprising:

producing a signal representative of ambient sound at a microphone associated with the personal wireless device;

mixing the signal representative of ambient sound and delayed received program data; and reproducing any or all of the ambient sound signal, the delayed received program data, and the mixed ambient sound signal and delayed received program data.

97. The method for operating a personal wireless device of claim 96 wherein the ambient sound signal, or the delayed received program data, and/or the mixed ambient sound signal and delayed received program data are reproduced by one or more personal sound transducers connected with the personal wireless device.

98. The method for operating a personal wireless device of claim 95 wherein the stored ambient sound signal, the stored delayed received program data, and the stored mixed ambient sound signal and delayed received program data, may be reproduced, played back, re-mixed, re-recorded and/or exported.

99. The method for operating a personal wireless device of claim 60 wherein a concert and/or event proprietor or operator or broadcaster may charge separate and distinct fees for different levels of access, for granting rights and/or for authorizing a package including for the personal wireless device to be enabled: to receive the audio program to listen only or to listen and adjust, to receive the audio program to listen only to L+R stereo audio or to listen and adjust L+R stereo audio, to receive a multi-track stereo audio program to listen only or to listen and adjust only, to receive the video program to view only, to receive the audio and video programs to listen and view, to record the stereo audio program, to record the multi-track audio program, and/or to record the video program, and wherein the foregoing levels of access may be purchased prior to or during the concert or event to which the levels of access pertain.

100. The method for operating a personal wireless device of claim 60 wherein a concert and/or event proprietor or operator or broadcaster may charge separate and distinct fees for different levels of access, including for the personal wireless device to be enabled: to receive audio data, to receive video data, to reproduce audio data, to reproduce video data, to record audio data, to record video data, to recall recorded audio data, to recall recorded video data, to reproduce recorded audio data for re-mixing, to reproduce recorded video data for re-mixing, to reproduce recorded tracks for re-mixing, to playback any of the foregoing, to re-record any of the foregoing at a later time, for granted rights, for a package, or a combination thereof.

101. The method for operating a personal wireless device of claim 100 wherein a concert and/or event proprietor or operator or broadcaster may charge separate and distinct fees for the personal wireless device to be enabled: to download any of the recalled, reproduced, and/or re-mixed data set forth in claim 100 via the Internet, a WiFi connection, a network, a wireless network, a USB connection, or via a combination thereof.

102. The method for operating a personal wireless device of claim 60 wherein the reproducing of program data by the personal wireless device is controlled by the operator of the venue, performance, transmitters, of a combination thereof.

103. The personal wireless device of claim 60 wherein the authorization:

enables receiving of audio program data, stereo audio program data, plural track audio program data, video program data, text data, a type of program data, or any combination thereof; or enables mixing of audio program data, stereo audio program data, plural track audio program data, video program data, text data, a type of program data, or any combination thereof, with other program data; or enables reproduction of delayed audio program data, stereo audio program data, plural track audio program data, video program data, text data, a type of program data, or any combination thereof; or enables mixing of delayed audio program data, stereo audio program data, plural track audio program data, video program data, text data, a type of program data, or any combination thereof, with other program data; or enables recording of audio program data, stereo audio program data, plural track audio program data, video program data, text data, a type of program data, or any combination thereof; or enables mixing of the recorded audio program data, stereo audio program data, plural track audio program data, video program data, text data, a type of program data, or any combination thereof; or enables recording of delayed audio program data, stereo audio program data, plural track audio program data, video program data, text data, a type of program data, or any combination thereof; or enables mixing of recorded delayed audio program data, stereo audio program data, plural track audio program data, video program data, text data, a type of program data, or any combination thereof; or enables re recording of audio program data, stereo audio program data, plural track audio program data, video program data, text data, a type of program data, or any combination thereof; or enables re mixing of the recorded audio program data, stereo audio program data, plural track audio program data, video program data, text data, a type of program data, or any combination thereof; or enables re recording of delayed audio program data, stereo audio program data, plural track audio program data, video program data, text data, a type of program data, or any combination thereof; or enables re mixing of recorded delayed audio program data, stereo audio program data, plural track audio program data, video program data, text data, a type of program data, or any combination thereof; or enables exporting of audio program data, stereo audio program data, plural track audio program data, video program data, text data, or a type of program data, that is received, reproduced, recorded, mixed, re mixed, and/or re recorded, or any combination thereof; or enables said personal wireless device to serve as a Karaoke device using any or a combination of the foregoing.

* * * * *

UNITED STATES PATENT AND TRADEMARK OFFICE
Certificate

Patent No. 8,290,174 B1 Patented: October 16, 2012

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Jeffrey Franklin Simon, Doylestown, PA (US); and James E. Meyer, Lancaster, PA (US).

Signed and Sealed this Twenty-eighth Day of January 2014.

STEVEN LOKE
*Supervisory Patent Examiner*
Art Unit 2818
Technology Center 2800